US009753061B2

(12) United States Patent
Sorensen et al.

(10) Patent No.: US 9,753,061 B2
(45) Date of Patent: Sep. 5, 2017

(54) AC CURRENT OR VOLTAGE SENSOR

(75) Inventors: Thomas Sorensen, Killarney (IE);
Connor Valentine O'Reilly, Lisnagry (IE)

(73) Assignee: THE NATIONAL MICROELECTRONICS APPLICATIONS CENTRE LIMITED, Limerick (IE)

( * ) Notice: Subject to any disclaimer, the term of this patent is extended or adjusted under 35 U.S.C. 154(b) by 276 days.

(21) Appl. No.: 13/989,322

(22) PCT Filed: Nov. 28, 2011

(86) PCT No.: PCT/IE2011/000061
§ 371 (c)(1),
(2), (4) Date: Sep. 19, 2013

(87) PCT Pub. No.: WO2012/070035
PCT Pub. Date: May 31, 2012

(65) Prior Publication Data
US 2014/0015516 A1    Jan. 16, 2014

(30) Foreign Application Priority Data

Nov. 26, 2010 (IE) ................... S2010/0744

(51) Int. Cl.
*G01R 15/18* (2006.01)
*G01R 19/00* (2006.01)

(52) U.S. Cl.
CPC .......... *G01R 19/00* (2013.01); *G01R 15/181* (2013.01)

(58) Field of Classification Search
CPC .... G01R 15/181; G01R 19/00; G01R 15/183; G01R 15/202; G01R 15/207; G01R 15/14;
(Continued)

(56) References Cited

U.S. PATENT DOCUMENTS 3,626,291 A * 12/1971 Yauch ................... G01R 15/181
324/117 R
4,795,973 A * 1/1989 Smith-Vaniz et al. ........ 324/126
(Continued)

FOREIGN PATENT DOCUMENTS

| WO | 01/79869 A1 | 10/2001 |
| WO | 2004/086063 A1 | 10/2004 |
| WO | 2005/103737 A1 | 11/2005 |

OTHER PUBLICATIONS

International Search Report for PCT/IE2011/000061 dated May 7, 2012.

*Primary Examiner* — Thang Le
(74) *Attorney, Agent, or Firm* — Sughrue Mion, PLLC

(57) ABSTRACT

A current sensing device (1) for producing a voltage indicative of an alternating current flowing in a conductor (2) comprises a support element (5) within which a carrier element (11) is located. The carrier element (11) comprises a primary substrate (12) which is formed into a multi-channel arcuate configuration defining a plurality of longitudinally extending channels (13) with side walls (16) on which planar coils (17) are formed on respective opposite first and second major surfaces (14,15) of the primary substrate (12). The carrier element (11) is located and retained in the multi-channel arcuate configuration in a primary retaining recess (38) in the support element (5) with the planar coils (17) defining planes which extend radially from a main central axis (6) defined by the support element (5). The planar coils (17) are connected in series so that the voltages produced in the coils by the alternating current flowing in the conductor (2) are summed in phase and the sum of the respective voltages is produced across terminals (20,21) of a first output port (19). Capacitive plates of a capacitor may also be formed on the first and second major surfaces (14,15) of the primary substrate (12) or on a
(Continued)

Figure 2:
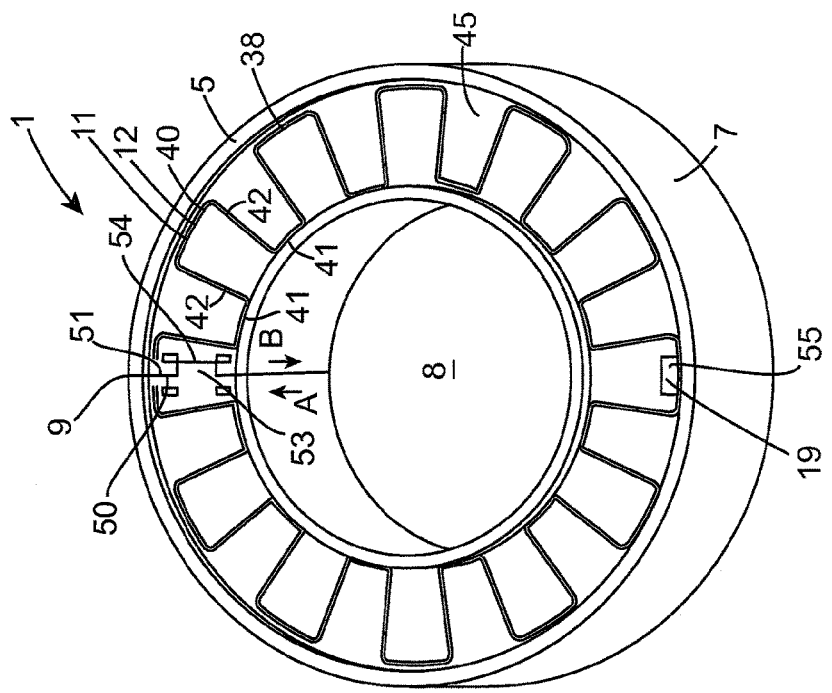

separate substrate in order to produce a signal indicative of the alternating voltage in the conductor (2).

27 Claims, 16 Drawing Sheets

(58) Field of Classification Search
CPC .... G01R 15/20; G01R 19/0092; G01R 13/02; G01R 21/08; G01R 11/32; G01R 33/18; G01R 33/02; H01L 41/12; H01L 41/16; H02K 41/06
USPC ........ 324/260, 249, 109, 235, 117 R, 117 H, 324/244, 251, 207.12–207.13; 310/26, 310/311
See application file for complete search history.

(56) References Cited

U.S. PATENT DOCUMENTS

| | | | |
|---|---|---|---|
| 4,803,425 A * | 2/1989 | Swanberg | G01P 3/487 324/173 |
| 5,055,816 A * | 10/1991 | Altman | H01F 17/0033 29/602.1 |
| 5,461,309 A * | 10/1995 | Baudart | G01R 19/32 324/105 |
| 5,852,395 A | 12/1998 | Bosco et al. | |
| 6,624,624 B1 * | 9/2003 | Karrer | G01R 15/181 324/117 R |
| 7,102,327 B2 * | 9/2006 | Ho | 318/812 |
| 7,109,838 B2 * | 9/2006 | Brennan | H01F 17/0033 257/E21.022 |
| 7,148,675 B2 * | 12/2006 | Itoh | G01R 15/202 324/117 H |
| 7,265,533 B2 * | 9/2007 | Lightbody et al. | 324/126 |
| 7,307,410 B2 * | 12/2007 | Shiokawa | H01F 5/003 324/76.11 |
| 8,847,576 B1 * | 9/2014 | Hannam | G01R 15/185 324/117 R |
| 2003/0112000 A1 * | 6/2003 | Sorenson, Jr. | 324/126 |
| 2004/0178875 A1 * | 9/2004 | Saito | G01R 15/181 336/200 |
| 2004/0257061 A1 * | 12/2004 | George de Buda | G01R 15/186 324/117 R |
| 2005/0156703 A1 * | 7/2005 | Twaalfhoven | H01F 17/0033 336/229 |
| 2007/0285089 A1 * | 12/2007 | Ibuki | G01R 15/181 324/260 |
| 2008/0079418 A1 * | 4/2008 | Rea | G01R 15/181 324/117 R |
| 2008/0311706 A1 * | 12/2008 | Dozen et al. | 438/127 |
| 2009/0205399 A1 * | 8/2009 | Sun et al. | 324/723 |
| 2009/0243389 A1 * | 10/2009 | Edo et al. | 307/31 |

* cited by examiner

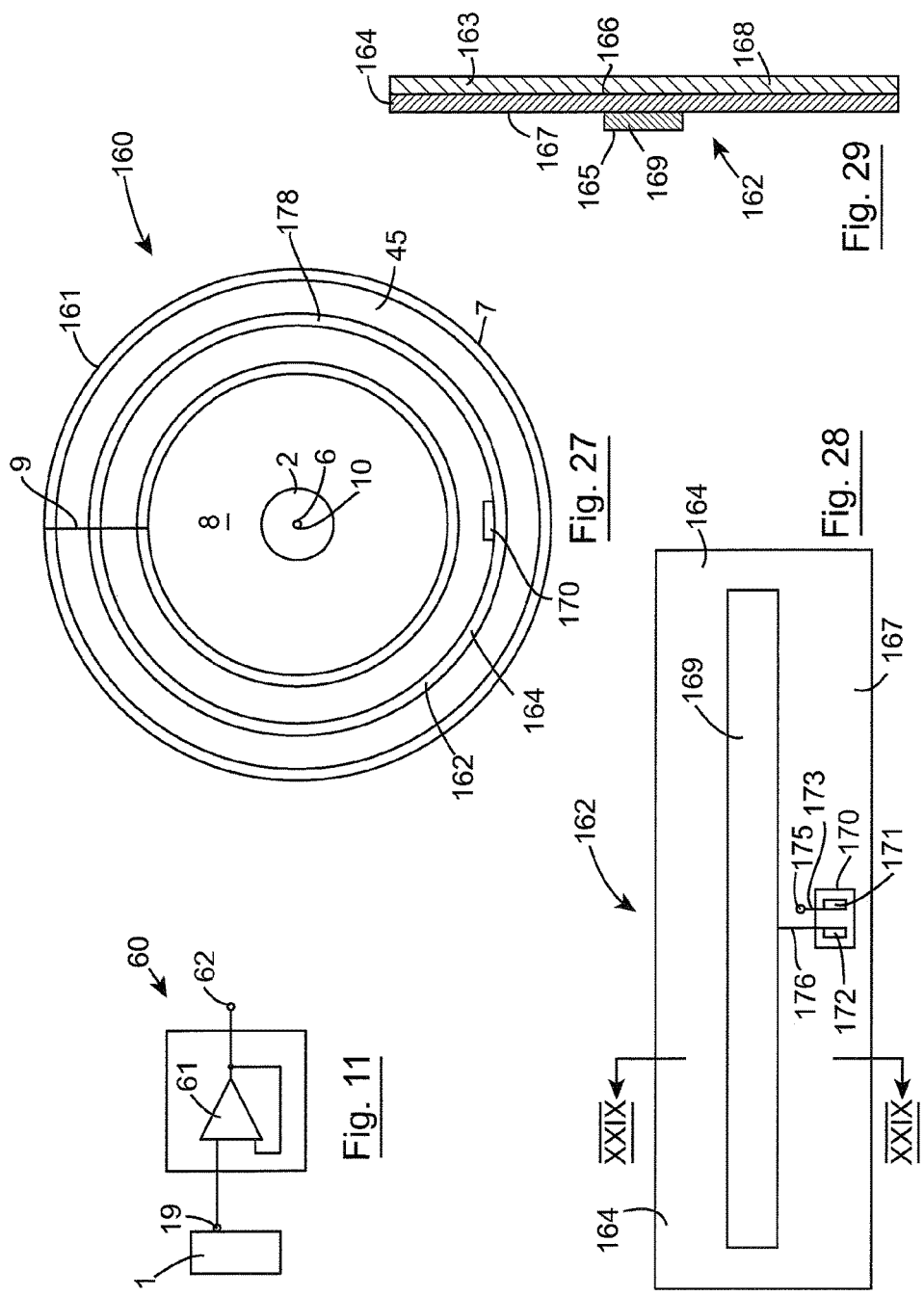

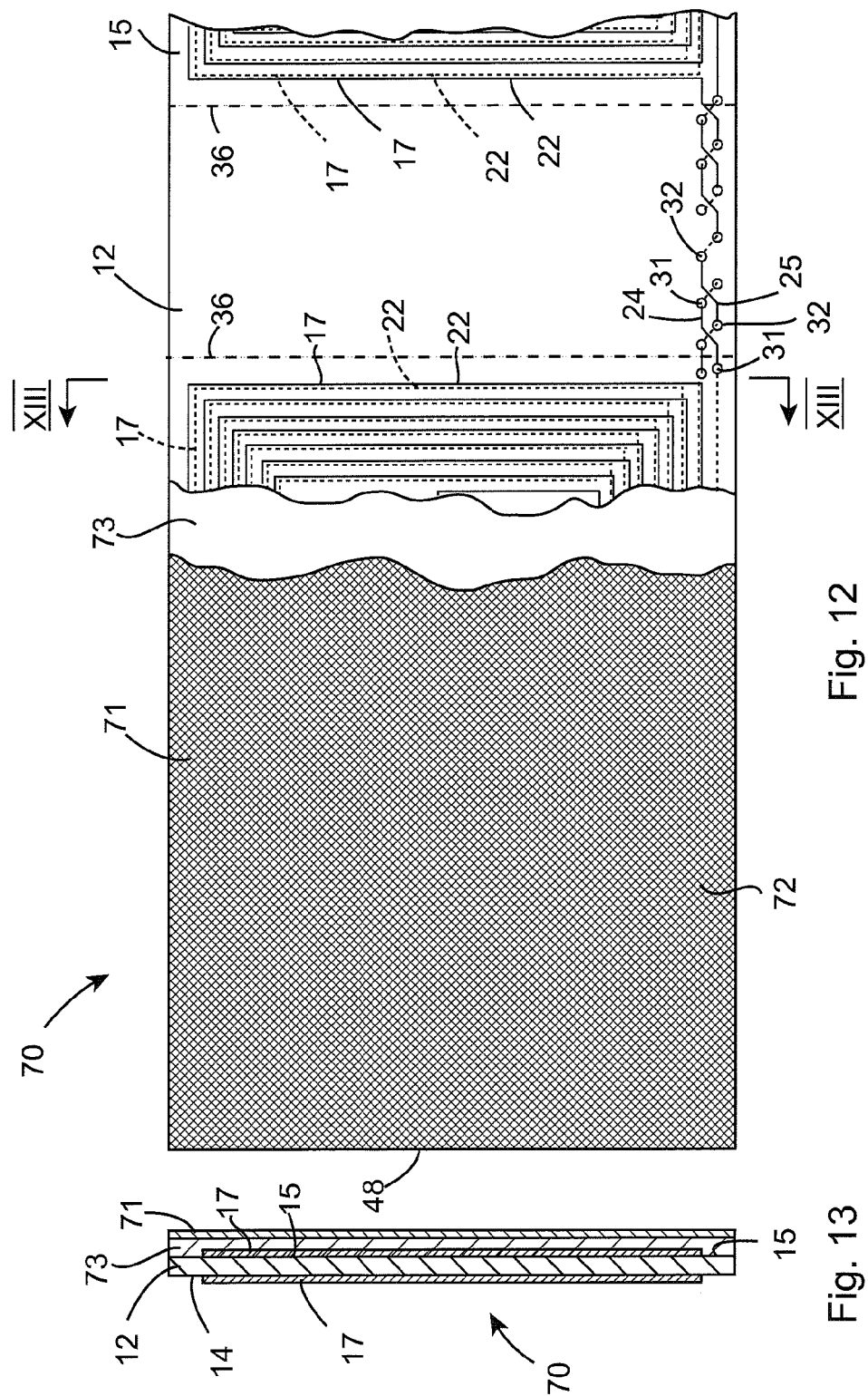

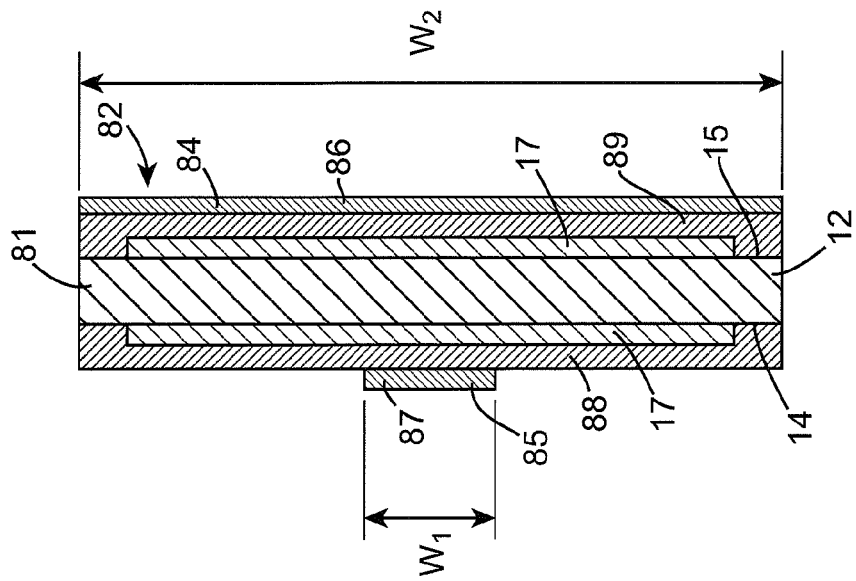
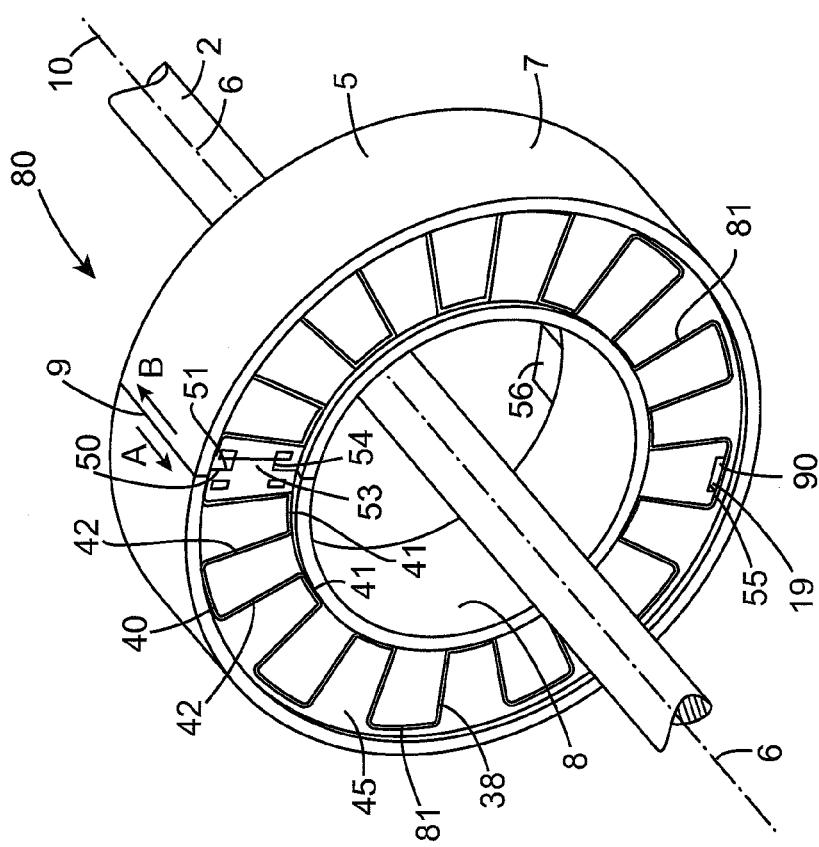
Fig. 17
Fig. 14

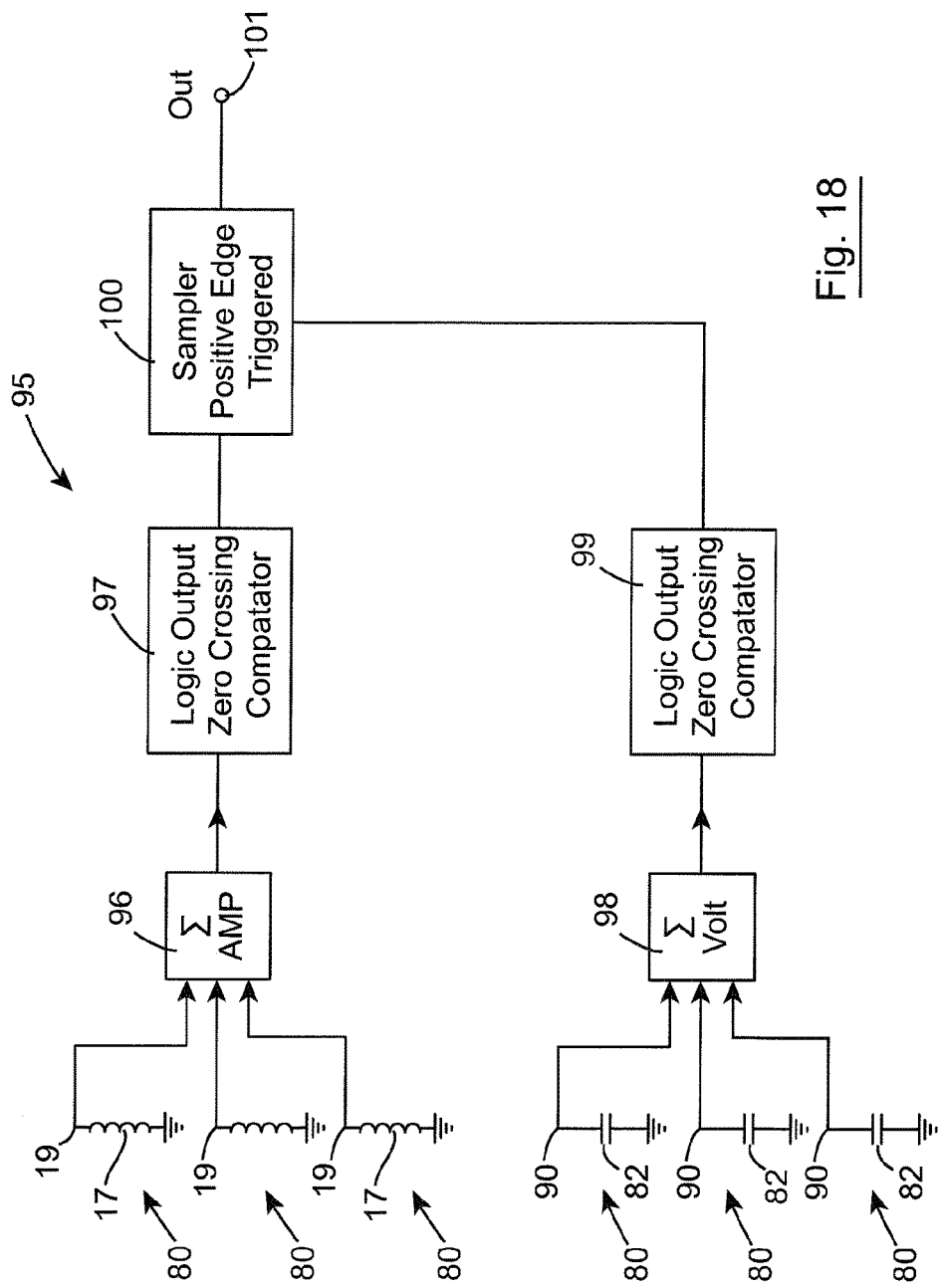

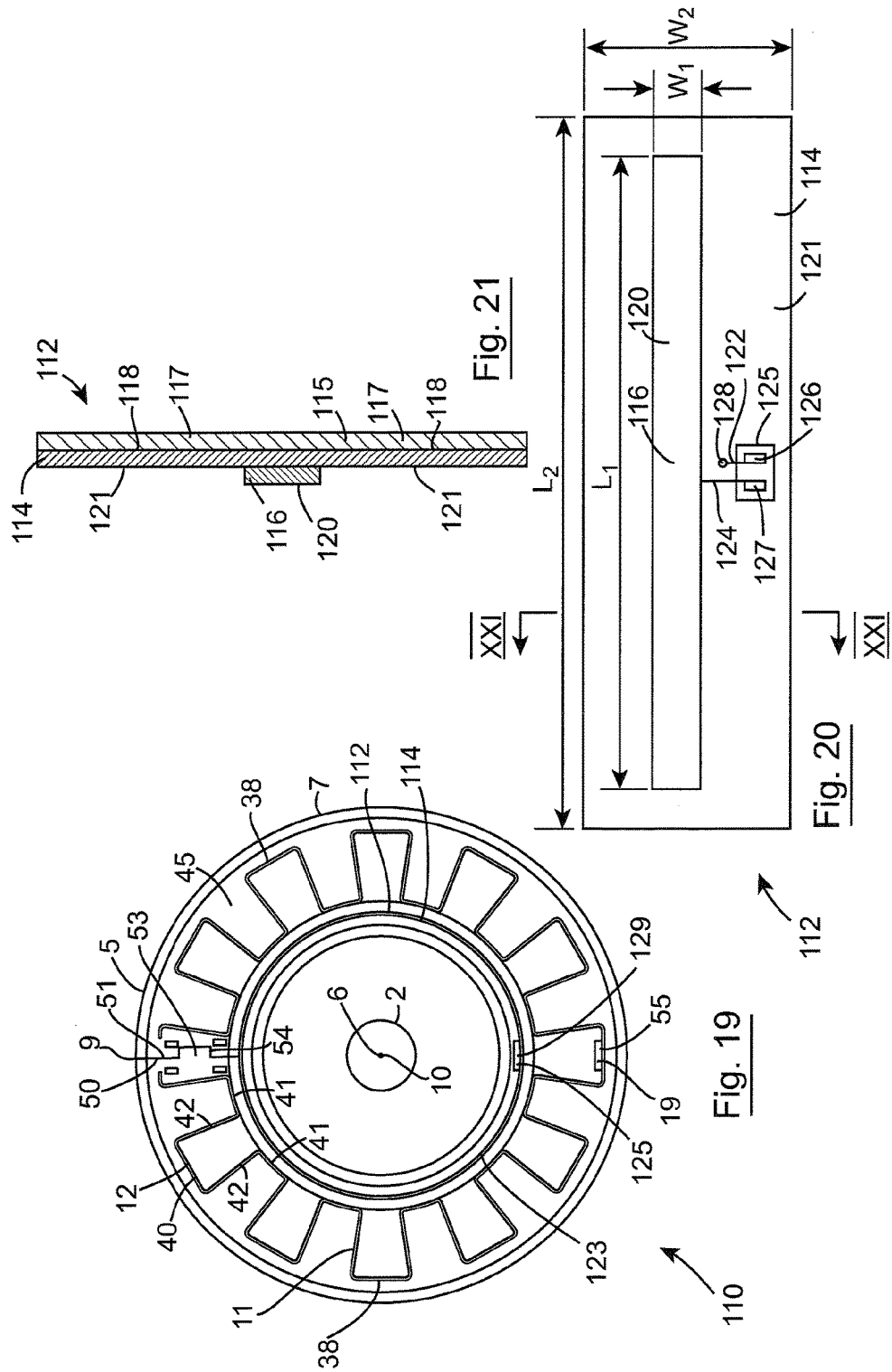

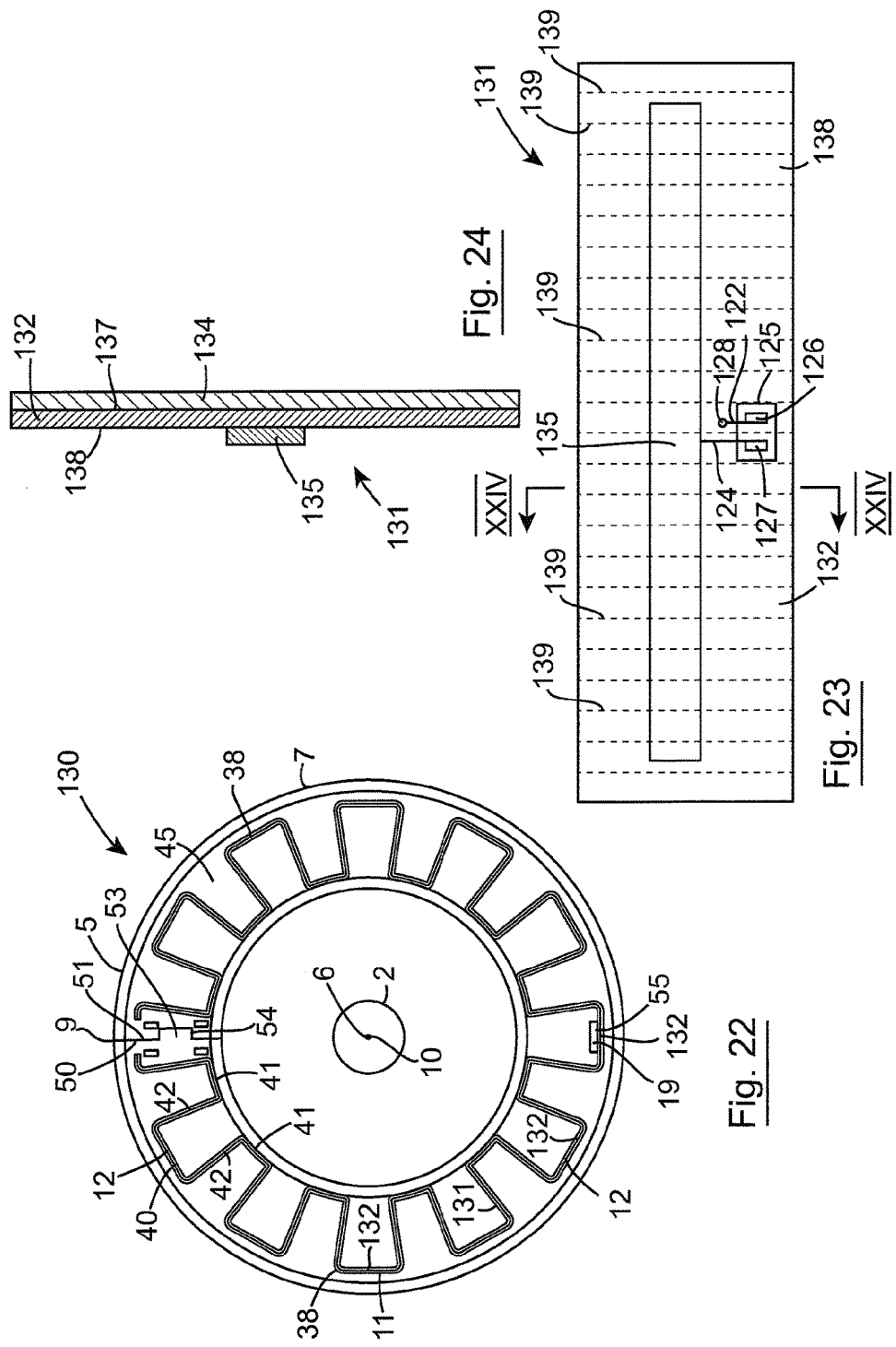

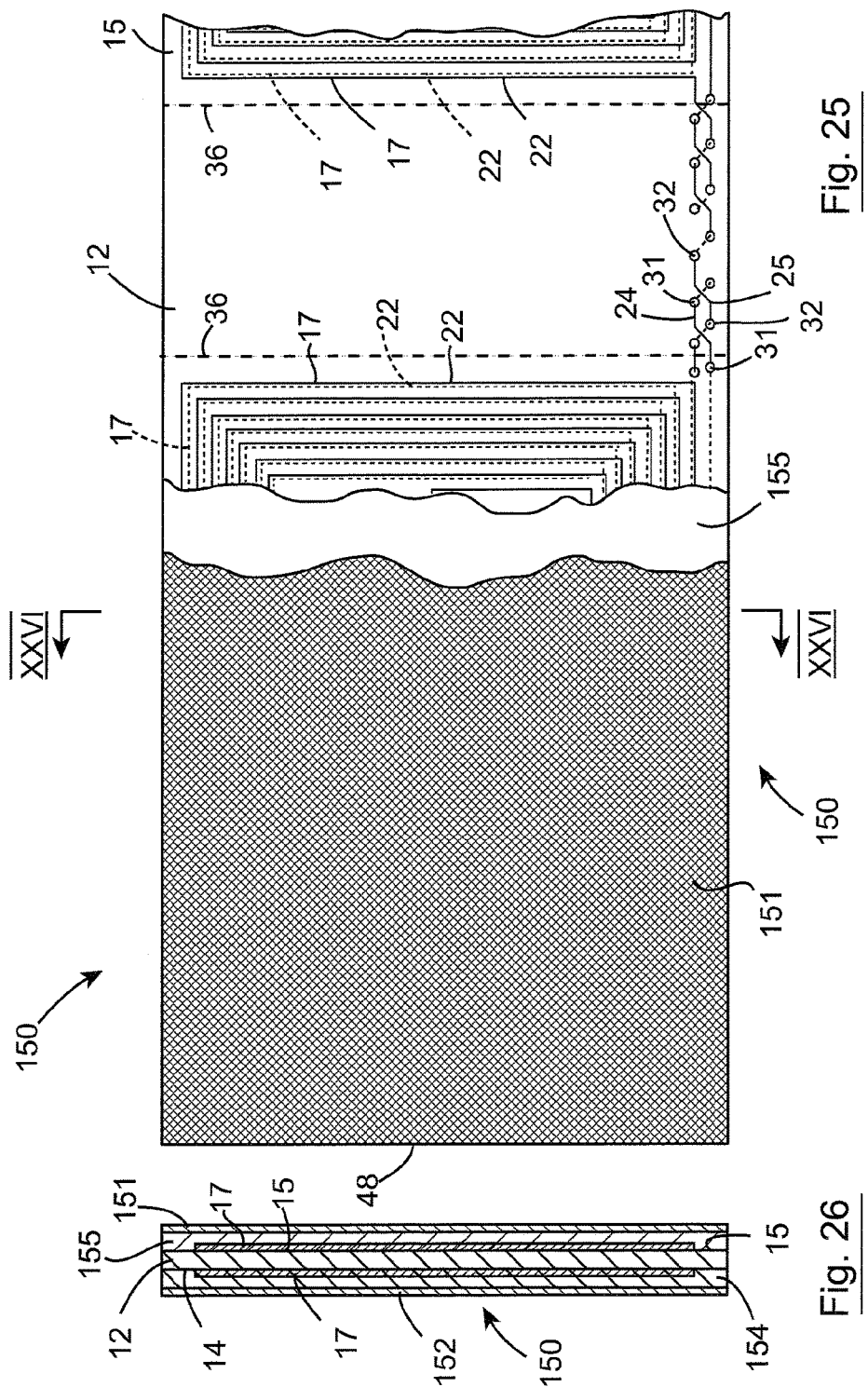

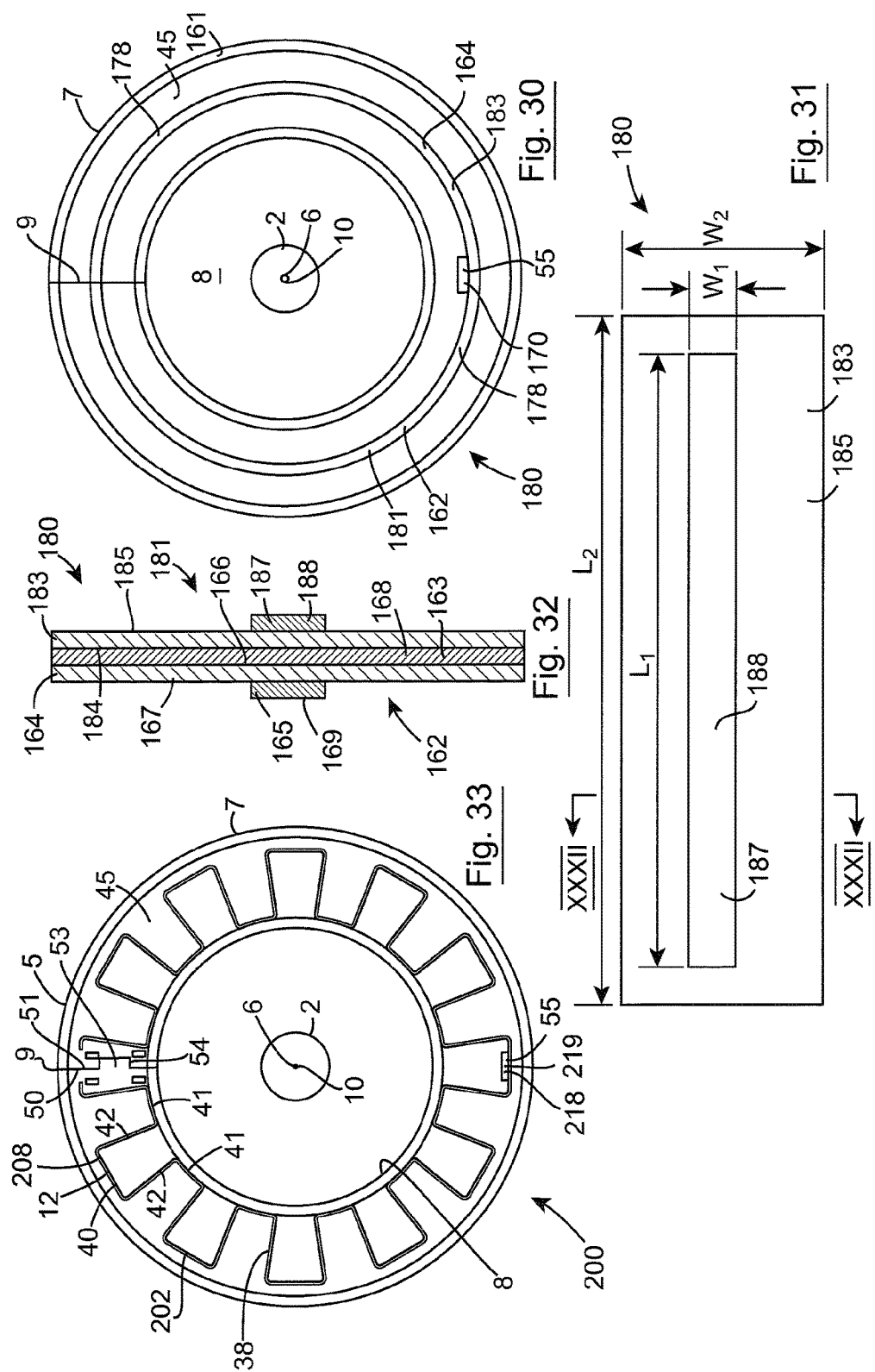

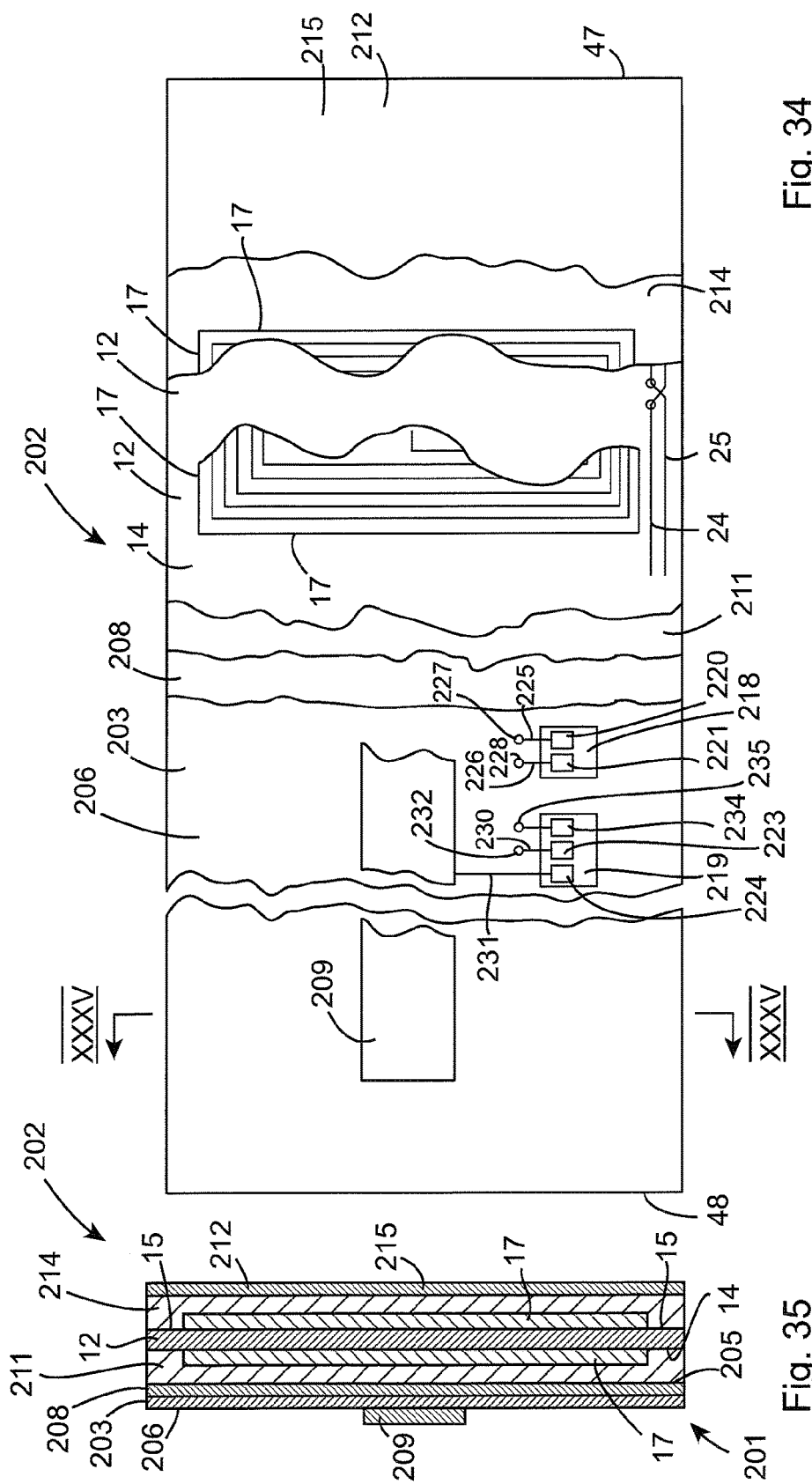

AC CURRENT OR VOLTAGE SENSOR

CROSS REFERENCE TO RELATED APPLICATIONS

This application is a National Stage of International Application No. PCT/IE2011/000061, filed on Nov. 28, 2011, claiming priority from Irish Patent Application No. S2010/0744, filed Nov. 26, 2010, the contents of all of which are incorporated herein by reference in their entirety.

The present invention relates to a current sensing device for producing a signal indicative of an alternating current flowing in a conductor. The invention also relates to a current sensing device for use in detecting imbalance current in a single phase or a multi-phase network carrying an alternating current. Further, the invention relates to a method for detecting an alternating current flowing in the conductor. The invention further relates to a carrier element for carrying coils of a current sensing device. The invention also relates to a voltage sensing device.

Current sensing devices for producing a signal indicative of an alternating current flowing in a conductor are known. Such devices commonly comprise a plurality of wire wound coils located in an annular housing which extends around the conductor. An alternating current flowing in the conductor induces voltages in the coil, which are then summed in phase. The summed voltage is indicative of the alternating current flowing in the conductor. However, such current sensing devices tend to be rather cumbersome and bulky and are also relatively complex. The use of such current sensing devices with voltage sensing devices for sensing both an alternating current and an alternating voltage in a conductor to produce a signal indicative of the direction of current flow are also known, and in general, comprise a current sensor for sensing the alternating current and a voltage sensor for detecting the alternating voltage. The current sensor typically is of the type described above with a plurality of wire wound coils located in an annular housing around the conductor, while the voltage sensor comprises a capacitor located adjacent the conductor. The alternating voltage in the current induces a voltage across the plates of the capacitor. Such current sensing devices and voltage sensing devices are commonly used in conjunction with electrical circuitry for analysing the voltage signal which is indicative of the magnitude of the alternating current flowing in the conductor and for analysing the voltage signal which is indicative of the alternating voltage in the conductor for producing a signal indicative of the magnitude of a current imbalance in a single phase or a multi-phase network and the direction of the imbalance current flow in such a network. However, all such current sensing and voltage sensing devices suffer from a number of disadvantages, in particular, such devices tend to be relatively large and cumbersome, and are also relatively complex. Additionally, and importantly, such devices are in general unsuitable for retrofitting to installed conductors.

There is therefore a need for a device for producing a signal indicative of an alternating current flowing in a conductor, and for use in determining current imbalance in a single phase or a multi-phase network and the direction of flow of the imbalance current which overcomes these problems.

The invention is directed towards providing such a current sensing device for producing a signal indicative of an alternating current flowing in a conductor. The invention is also directed towards providing a current sensing device for producing a signal indicative of an alternating current flowing in a conductor which also comprises a means for producing a signal indicative of an alternating voltage present in the conductor. Such a current sensing device would be suitable for detecting current imbalance in a single phase or a multi-phase alternating current network and for determining the direction of flow of the imbalance current. Further, the invention is directed towards a method for producing a signal indicative of an alternating current flowing in a conductor. The invention is also directed towards a voltage sensing device for producing a signal indicative of an alternating voltage present in a conductor. The invention is further directed towards a carrier element for carrying coils of a current sensing device.

According to the invention there is provided a current sensing device for producing a signal indicative of an alternating current flowing in a conductor, the current sensing device comprising a support element adapted to extend at least partly around the conductor and defining a main central axis, and a plurality of planar coils located in the support element and defining respective planes extending substantially along and substantially radially from the main central axis, the coils being circumferentially spaced apart around the support element and being electrically connected in series so that the voltages induced in the coils by an alternating current flowing in the conductor are summed in phase to produce the signal indicative of the alternating current flowing in the conductor.

Preferably, the coils are connected in series by conductors configured as twisted pairs. Alternatively, the coils are connected in series by conductors configured as non-twisted pairs.

Advantageously, the coils are equi-spaced apart circumferentially around the support element.

Preferably, at least one carrier is provided for supporting the coils in the support element.

In one embodiment of the invention the carrier comprises an elongated primary substrate defining opposite first and second major surfaces and being configured into a multi-channel configuration defining a plurality of adjacent channels extending parallel to the main central axis, the channels having opposite side walls defining planes extending substantially along and substantially radially from the main central axis, the coils being formed on at least the first major surface of the primary substrate on the respective side walls of the channels. Preferably, the coils are formed on the second major surface of the primary substrate on the side walls of the channels. Advantageously, the coils on the second major surface of the primary substrate are equi-spaced apart circumferentially around the main central axis. Ideally, the coils on the first and second major surfaces of the primary substrate are connected in series.

In one aspect of the invention the coils on the first and second major surfaces of the primary substrate are connected in series by the conductors configured as twisted pairs.

Preferably, the conductors configured as twisted pairs are formed on both the first and second surfaces of the primary substrate. Preferably, the conductors configured as twisted pairs comprise electrically conductive tracks formed on the primary substrate. Advantageously, each track forming one conductor of a pair of conductors configured as a twisted pair comprises a plurality of interconnected segments formed alternately on the respective opposite first and second major surfaces of the primary substrate.

Preferably, the coils on the first surface of the primary substrate are equi-spaced apart circumferentially around the main central axis.

Advantageously, the primary substrate in the multi-channel configuration is configured into an arcuate configuration extending at least partly around the main central axis. Advantageously, the centre of radius of the primary substrate in the arcuate configuration substantially coincides with the main central axis defined by the support element.

Preferably, the primary substrate is formed into the multi-channel configuration by bending the primary substrate transversely at spaced apart intervals along the length of the primary substrate. Advantageously, the primary substrate in arcuate configuration extends substantially completely around the main central axis. Preferably, the support element is adapted to retain the primary substrate in the multi-channel arcuate configuration.

Alternatively, a plurality of carriers are provided, each carrier supporting at least one coil. Preferably, each carrier comprises a primary substrate defining first and second opposite major surfaces, and the at least one coil is provided on one of the first and second major surfaces of the primary substrate. Preferably, a coil is provided on each of the first and second major surfaces of each primary substrate. Advantageously, each primary substrate is supported in the support element, each primary substrate defining a plane extending substantially along and substantially radially from the main central axis.

Preferably, the coils on each primary substrate are connected in series, and are connected in series with the coils on the other primary substrates. Advantageously, the coils of the respective primary substrates are connected in series by twisted pairs of wires. Ideally, the coils on the respective opposite first and second major surfaces of the or each primary substrate are aligned in pairs with the axes defined by the coils of each pair of coils substantially aligned with each other.

In another aspect of the invention a first output port is provided on which an output voltage is produced, the output voltage being equal to the sum of the voltages induced in the respective coils summed in phase. Preferably, the first output port is located on the or one of primary substrates.

In one aspect of the invention, the support element comprises a primary retaining recess for receiving and retaining the at least one of the coils extending in the corresponding plane extending substantially along and substantially radially from the main central axis.

Preferably, the primary retaining recess comprises a plurality of circumferentially spaced apart radial recesses extending longitudinally into the support element and defining respective planes extending substantially along and substantially radially from the main central axis, each of the recesses being adapted for accommodating at least one of the coils. Advantageously, the radial recesses formed in the support element are adapted for accommodating respective portions of the primary substrate or respective primary substrates on which coils are carried. Preferably, each primary substrate is located in a corresponding recess in the support element. Advantageously, the radial recesses are interconnected to define the multi-channel configured primary substrate.

In another aspect of the invention the recesses of each alternate pair of radial recesses are joined by a corresponding outer circumferential recess, and the recesses of each other alternate pair of radial recesses are joined by a corresponding inner circumferential recess, the inner and outer circumferential recesses extending longitudinally into the support element, and in a general circumferential direction, the radial and inner and outer circumferential recesses being adapted to accommodate the primary substrate in the multi-channel arcuate configuration. Preferably, the radial recesses formed in the support element are equi-spaced apart circumferentially around the support element. Advantageously, the support element extends substantially completely around the main central axis.

In one aspect of the invention each coil comprises an electrically conductive track formed on the corresponding primary substrate. Preferably, each electrically conductive track is formed by one of printing an electrically conductive material onto the primary substrate in the form of the track, depositing an electrically conductive material onto the primary substrate in the form of a track, and etching a track from an electrically conductive material formed on the primary substrate to form the track.

Preferably, the primary substrate comprises a flexible material. Advantageously, the primary substrate comprises an electrically insulating material. Preferably, the primary substrate is of thickness in the range of 0.01 mm to 2.00 mm. Advantageously, the primary substrate is of thickness in the range of 0.02 mm to 1.0 mm. Ideally, the primary substrate is of thickness of approximately 0.04 mm.

In one aspect of the invention the primary substrate comprises a plastics material. Preferably, the primary substrate comprises a polyamide material. Advantageously, the primary substrate comprises PEEK material.

Preferably, the support element is of annular shape defining a central opening extending therethrough for accommodating the conductor through the support element. Advantageously, the support element is radially split for accommodating engagement of the support element onto the conductor with the conductor extending through the central opening of the support element for retrofitting the support element onto a conductor.

In another aspect of the invention a shielding means is provided for minimising the effect on the coils of external stray electric and magnetic fields and in particular the effect on the coils of magnetic fields of relatively high frequency greater than 20 KHz.

Preferably, the shielding means comprises an electrically conductive shield located on the primary substrate over the coils on at least one of the first and second major surfaces thereof. Advantageously, the electrically conductive shield is located adjacent the one of the first and second major surfaces of the primary substrate which is remote from the main central axis defined by the support element.

In another aspect of the invention an electrically conductive shield is located adjacent each of the first and second major surfaces of the primary substrate.

Preferably, each electrically conductive shield is electrically insulated from the adjacent coils by a layer of electrically insulating material located between the electrically conductive shield and the coils. Advantageously, each electrically conductive shield comprises an electrically conductive panel. Ideally, each electrically conductive shield is of area substantially similar to the area of the primary substrate.

Preferably, each electrically conductive shield is adapted for coupling to ground so that the electrically conductive shield forms a ground phase.

In one aspect of the invention each electrically conductive shield comprises an electrically conductive material formed on the primary substrate by one of printing, metal deposition and etching.

In another aspect of the invention a voltage sensing means is provided for producing a signal indicative of an alternating voltage present in the conductor. Preferably, the voltage sensing means comprises a capacitor. Advantageously, the capacitor is supported in the support means.

In one aspect of the invention the capacitor comprises a first capacitor plate and a second capacitor plate spaced apart from the first capacitor plate and a dielectric located between the first and second capacitor plates. Advantageously, the first and second capacitor plates comprise first and second electrically conductive plates.

Preferably, the second capacitor plate is located between the first capacitor plate and the main central axis defined by the support element.

In one aspect of the invention the first capacitor plate is adapted to be held at ground potential.

In another aspect of the invention the area of the second capacitor plate is less than the area of the first capacitor plate. Preferably, the second capacitor plate is of length in a general circumferential direction relative to the main central axis not more than 99% of the length of the first capacitor plate in the general circumferential direction. Advantageously, the second capacitor plate is of length in a general circumferential direction relative to the main central axis not less than 50% of the length of the first capacitor plate in the general circumferential direction. Ideally, the second capacitor plate is of length in a general circumferential direction relative to the main central axis not more than 97% of the length of the first capacitor plate in the general circumferential direction.

Preferably, the width of the second capacitor plate in a general longitudinal direction relative to the main central axis is not more than 90% of the width of the first capacitor plate in the general longitudinal direction. Advantageously, the width of the second capacitor plate in a general longitudinal direction relative to the main central axis is not less than 10% of the width of the first capacitor plate in the general longitudinal direction. Ideally, the width of the second capacitor plate in a general longitudinal direction relative to the main central axis is not more than 22% of the width of the first capacitor plate in the general longitudinal direction.

Preferably, the second capacitor plate is substantially centred relative to the first capacitor plate.

In one aspect of the invention the dielectric comprises the primary substrate, and the first capacitor plate is located adjacent the second major surface of the primary substrate, and the second capacitor plate is located adjacent the first major surface of the primary substrate. Advantageously, the coils on the second major surface of the primary substrate are located between the second major surface of the primary substrate and the first capacitor plate. Preferably, the first capacitor plate is electrically insulated from the coils on the second major surface of the primary substrate by a first layer of electrically insulating material located between the first capacitor plate and the coils on the second major surface of the primary substrate.

Preferably, the coils on the first major surface of the primary substrate are located between the first major surface of the primary substrate and the second capacitor plate. Advantageously, the second capacitor plate is electrically insulated from the coils on the first major surface of the primary substrate by a second layer of electrically insulating material located between the second capacitor plate and the coils on the first major surface of the primary substrate.

In another aspect of the invention the first capacitor plate is of area substantially similar to the area of the primary substrate.

Alternatively, the dielectric comprises a secondary substrate defining opposite first and second major surfaces, the first capacitor plate being located on the first major surface of the secondary substrate, and the second capacitor plate being located on the second major surface of the secondary substrate.

Preferably, the secondary substrate is supported in the support element and extends at least partly around the main central axis. Advantageously, the area of the first capacitor plate is of area substantially similar to the area of the secondary substrate.

Preferably, the width of the secondary substrate in a general longitudinal direction relative to the main central axis is substantially similar to the width of the primary substrate in the general longitudinal direction relative to the main central axis, and preferably, the length of the secondary substrate in a general circumferential direction relative to the main central axis is substantially similar to the length of the primary substrate in the general circumferential direction relative to the main central axis.

Advantageously, the secondary substrate extends substantially completely around the main central axis.

In one aspect of the invention the secondary substrate is configured into a multi-channel configuration substantially similar to that of the primary substrate.

In another aspect of the invention, the primary and secondary substrates are secured together with the coils on the first major surface of the primary substrate and the first capacitor plate located between the primary and secondary substrates, and preferably, a first layer of electrically insulating material is located between the coil on the first major surface of the primary substrate and the first capacitor plate.

In another aspect of the invention, one of the electrically conductive shields is located adjacent the second major surface of the primary substrate with the coils on the second major surface of the primary substrate located between the electrically conductive shield and the primary substrate, and preferably, a second layer of electrically insulating material is located between the electrically conductive shield and the coils on the second major surface of the primary substrate.

Preferably, the secondary substrate is located along with the primary substrate in the primary retaining recess formed in the support element for accommodating the primary substrate.

In another aspect of the invention the secondary substrate is substantially cylindrical. Preferably, the secondary substrate is located in a secondary recess formed in the support means. Advantageously, the secondary recess is a substantially cylindrical recess defining a central geometrical axis which substantially coincides with the main central axis defined by the support element. Ideally, the secondary recess extends into the support element from one end thereof and extends longitudinally into the support element relative to the main central axis defined by the support element.

Preferably, the secondary substrate is located between the primary substrate and the main central axis.

In one aspect of the invention a second output port is provided on which the voltage across the first and second capacitor plates is produced to provide the signal indicative of the alternating voltage present in the conductor. Preferably, the second output port is located on one of the primary substrate and the secondary substrate.

In another aspect of the invention the first and second capacitor plates comprise respective first and second electrically conductive panels.

Advantageously, the first and second electrically conductive panels are formed on the corresponding one of the primary substrate and the secondary substrate by one of printing, metal deposition and etching.

The invention also provides a carrier element comprising an elongated primary substrate of a bendable material defining a pair of opposite first and second major surfaces and having a plurality of planar coils formed on at least one of the first and second major surfaces thereof at spaced apart intervals along the primary substrate, the primary substrate being adapted to be formed into a multi-channel configuration and to be supported in a support element with the coils circumferentially spaced apart around a main central axis defined by the support element and defining respective planes extending substantially along and substantially radially from the main central axis defined by the support element.

Further the invention provides a method for producing a signal indicative of an alternating current flowing in a conductor, the method comprising providing a support element adapted to extend at least partly around the conductor and defining a main central axis, providing a plurality of planar coils in the support element with the coils defining respective planes extending substantially along and substantially radially from the main central axis and being spaced apart circumferentially around the main central axis, and electrically connecting the coils in series so that the voltages induced in the coils by an alternating current flowing in the conductor are summed in phase to produce the signal indicative of the alternating current flowing in the conductor.

The invention also provides a voltage sensing device for producing a signal indicative of an alternating voltage in a conductor, the voltage sensing device comprising a support element adapted to extend at least partly around the conductor and defining a main central axis, a first capacitor carried in the support means, the first capacitor comprising a first substrate defining opposite first and second major surfaces, a first capacitor plate located on the first major surface of the first substrate, and a second capacitor plate located on the second major surface with the first substrate located therebetween forming a dielectric of the first capacitor, the first substrate being configured into an arcuate configuration, and extending at least partly around the main central axis defined by the support element.

Preferably, the first and second capacitor plates comprise first and second electrically conductive plates.

Advantageously, the second capacitor plate is located between the first capacitor plate and the main central axis defined by the support element. Preferably, the first capacitor plate is adapted to be held at ground potential.

In one aspect of the invention the area of the second capacitor plate is less than the area of the first capacitor plate. Preferably, the second capacitor plate is of length in a general circumferential direction relative to the main central axis not more than 99% of the length of the first capacitor plate in the general circumferential direction. Advantageously, the second capacitor plate is of length in a general circumferential direction relative to the main central axis not less than 50% of the length of the first capacitor plate in the general circumferential direction. Ideally, the second capacitor plate is of length in a general circumferential direction relative to the main central axis not more than 97% of the length of the first capacitor plate in the general circumferential direction.

Preferably, the width of the second capacitor plate in a general longitudinal direction relative to the main central axis is not more than 90% of the width of the first capacitor plate in the general longitudinal direction. Advantageously, the width of the second capacitor plate in a general longitudinal direction relative to the main central axis is not less than 10% of the width of the first capacitor plate in the general longitudinal direction. Ideally, the width of the second capacitor plate in a general longitudinal direction relative to the main central axis is not more than 22% of the width of the first capacitor plate in the general longitudinal direction.

Preferably, the second capacitor plate is substantially centred relative to the first capacitor plate. Advantageously, the area of the first capacitor plate is substantially similar to the area of the substrate.

Preferably, the substrate comprises a flexible material. Advantageously, the substrate comprises an electrically insulating material.

In one aspect of the invention the substrate is of thickness in the range of 0.01 mm to 2.0 m. Preferably, the substrate is of thickness in the range of 0.02 mm to 1.0 mm. Ideally, the substrate is of thickness of approximately 0.04 mm.

In one aspect of the invention a first output port is provided on which the voltage across the first and second capacitor plates is produced to provide the signal indicative of the alternating voltage present in the conductor. Preferably, the first output port is located on the substrate.

In another aspect of the invention a second capacitor is provided for producing a signal indicative of external stray electric and magnetic fields. Preferably, the second capacitor comprises a second substrate having opposite first and second major surfaces, the first major surface of the second substrate being located adjacent the first capacitor plate, and a third capacitor plate being located on the second major surface of the second substrate with the second substrate located between the first and third capacitor plates and forming a dielectric and with the first and third capacitor plates co-operating to form the second capacitor. Advantageously, the area of the third capacitor plate is less than the area of the first capacitor plate.

Advantageously, the third capacitor plate is of area substantially similar to the area of the second capacitor plate.

In one aspect of the invention, the third capacitor plate is of length in a general circumferential direction relative to the main central axis which is substantially similar to the length of the second capacitor plate in the general circumferential direction. In another aspect of the invention, the width of the third capacitor plate in a general longitudinal direction relative to the main central axis is substantially similar to the width of the second capacitor plate in the general longitudinal direction. Preferably, the third capacitor plate is substantially centred relative to the first capacitor plate.

In another aspect of the invention, the area of the second substrate is substantially similar to the area of the first substrate. Preferably, the second substrate is substantially similar to the first substrate.

Preferably, a second output port is provided on which the voltage developed across the first and third capacitor plates is produced to provide the signal indicative of external stray electric and magnetic fields. Advantageously, the second output port is located on one of the first and second substrates.

Preferably, each capacitor plate comprises an electrically conductive panel. Advantageously, each capacitor plate is formed by one of printing, metal deposition and etching.

In one aspect of the invention each substrate extends substantially completely around the main central axis.

Preferably, the support element is adapted to retain each substrate in the arcuate configuration. Advantageously, the support element comprises a retaining recess for receiving each substrate and for retaining each substrate in the arcuate configuration. Advantageously, the support element extends substantially completely around the main central axis.

In one aspect of the invention the support element is of annular shape defining a central opening extending therethrough for accommodating the conductor through the support element. Preferably, the support element is radially split for accommodating engagement of the support element onto the conductor with the conductor extending through the central opening of the support element for retrofitting the support element onto a conductor.

The advantages of the invention are many. A particularly important advantage of the invention is that the current sensing device is particularly suitable for retrofitting to an installed conductor, and is also relatively inexpensive to produce. The current sensing device is also suitable for fitting onto a conductor prior to the conductor being located in situ. The provision of the capacitor in the current sensing device for producing a signal indicative of an alternating voltage present in the conductor produces a particularly advantageous form of the current sensing device. By applying the signal indicative of the alternating current flowing in a conductor and the signal indicative of the alternating voltage present in the conductor from the current sensing device or devices fitted on the conductor or conductors of a single or multi-phase alternating current network to suitable signal processing apparatus, an imbalance current in the single or multi-phase network can be detected, and the direction of flow of the imbalance current in the network can be determined.

The provision of one or more electrically conductive shields provides a particularly advantageous form of the current sensing device, since the provision of the electrically conductive shield or shields minimises the effects of external stray electric and magnetic fields on the coils, and in particular the effect of magnetic fields of relatively high frequencies greater than 20 KHz. The provision of the coils as planar coils formed on one or both of the major surfaces of a primary substrate which can be bent to form the multi-channel arcuate configuration, whereby the channels comprise side walls on which the coils are formed provides a particularly advantageous and cost effective form of the current sensing device.

The voltage sensing device according to the invention also has many advantages, and in particular, the voltage sensing device provides a relatively inexpensive voltage sensing device. The provision of the second capacitor in the voltage sensing device provides the additional advantage that correction can be made for the effects of external stray electric and magnetic fields in the voltage produced by the first capacitor which is indicative of the alternating voltage in the conductor.

Figure 1:
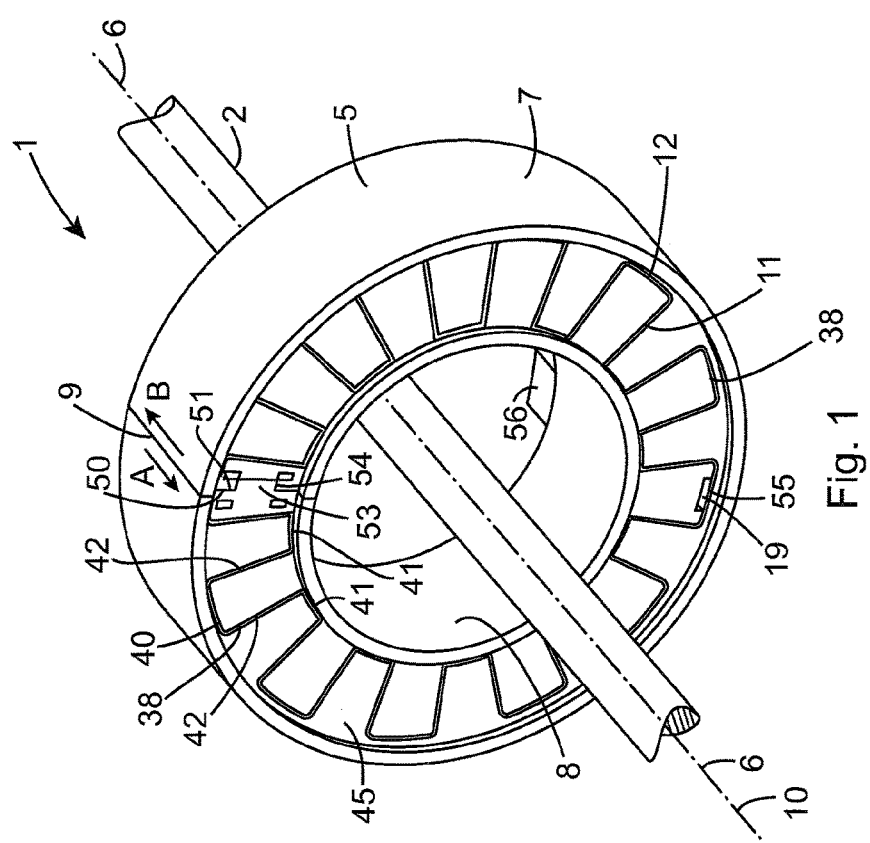
Figure 4:
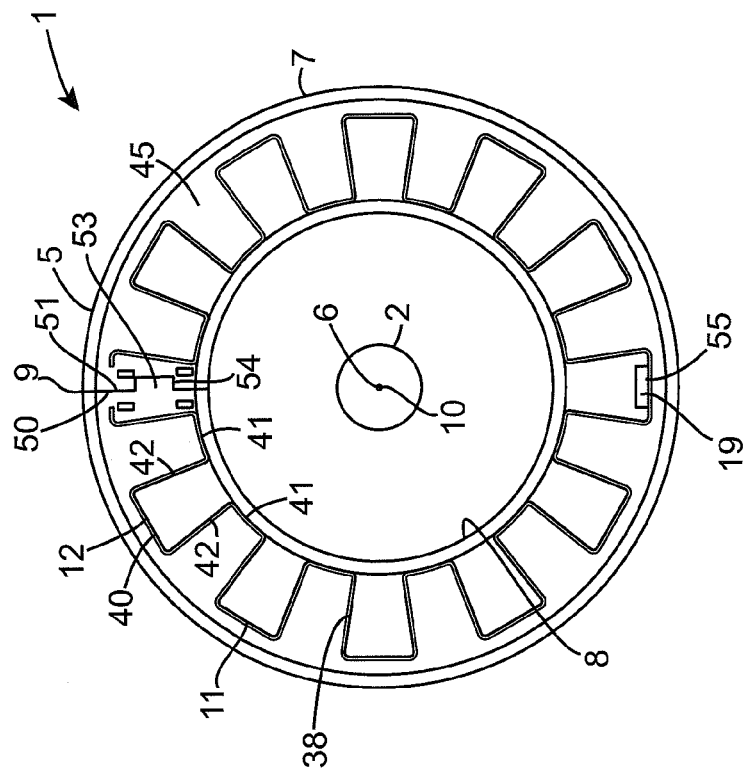
Figure 3:
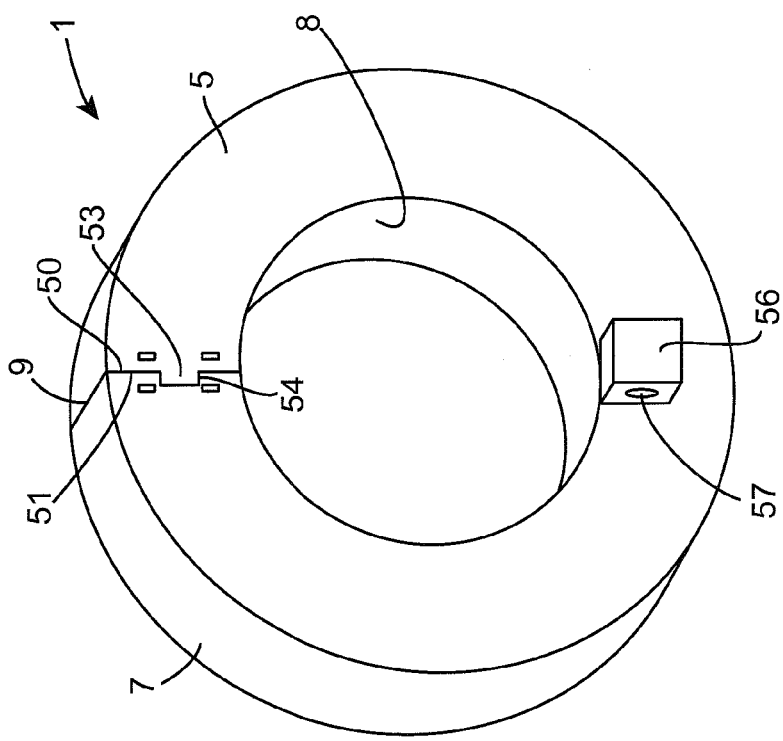
Figure 5:
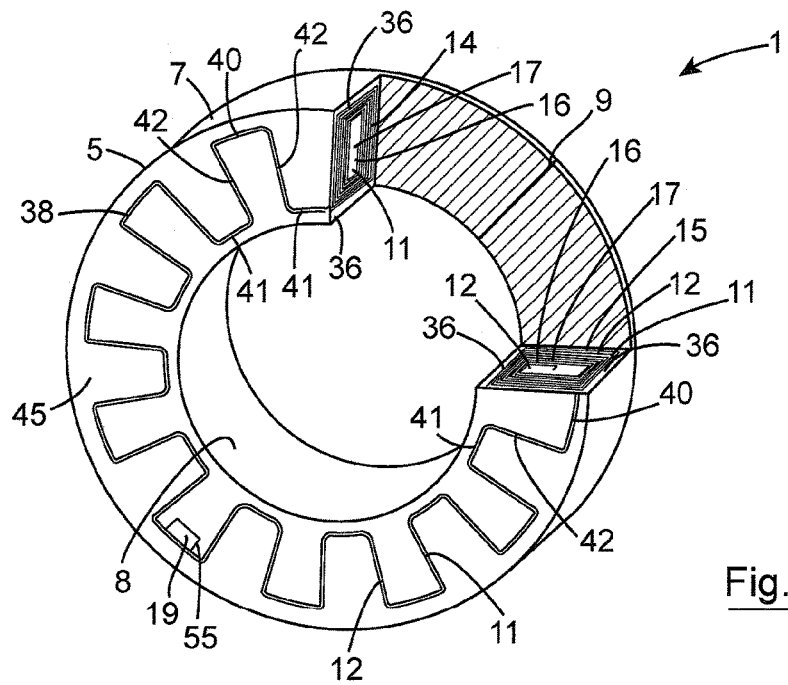
Figure 9:
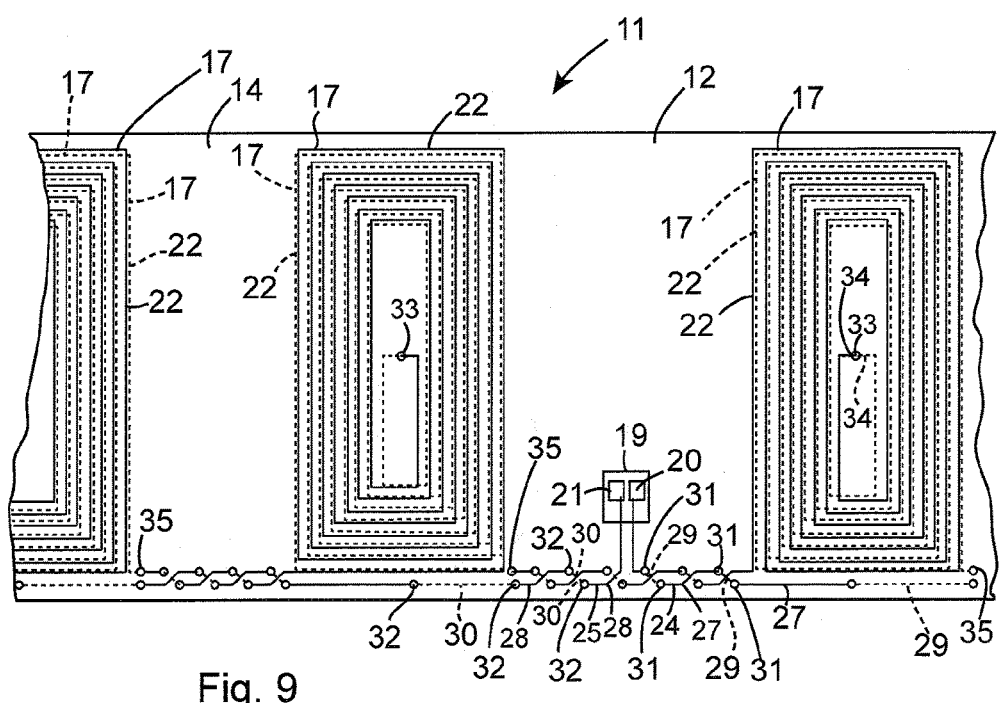
Figure 6:
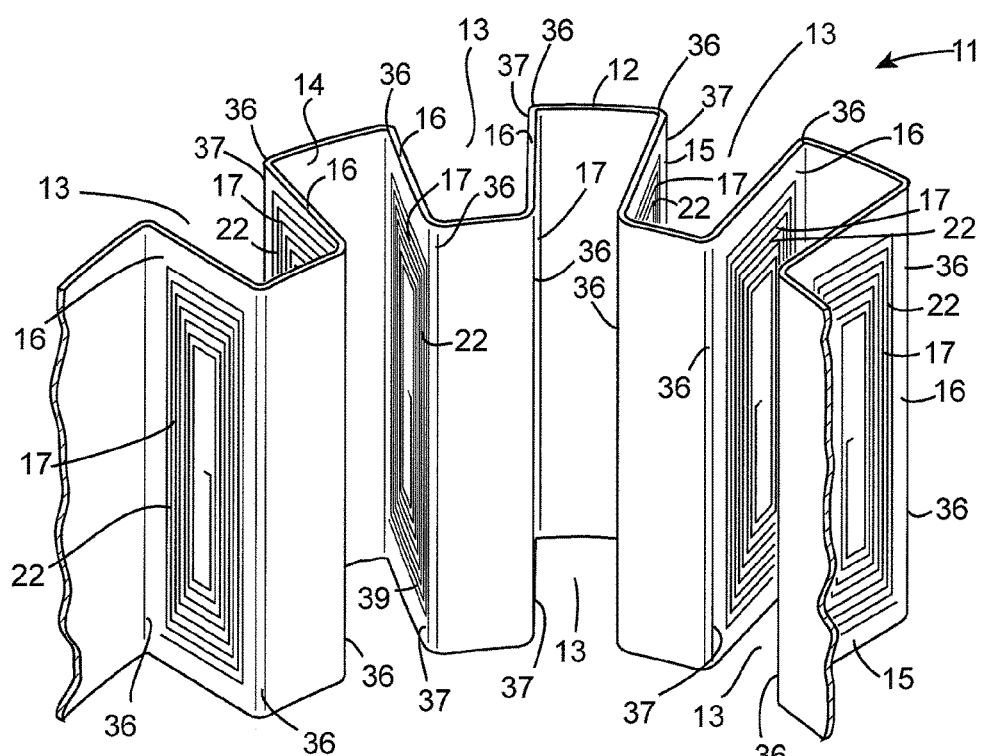
Figure 10:
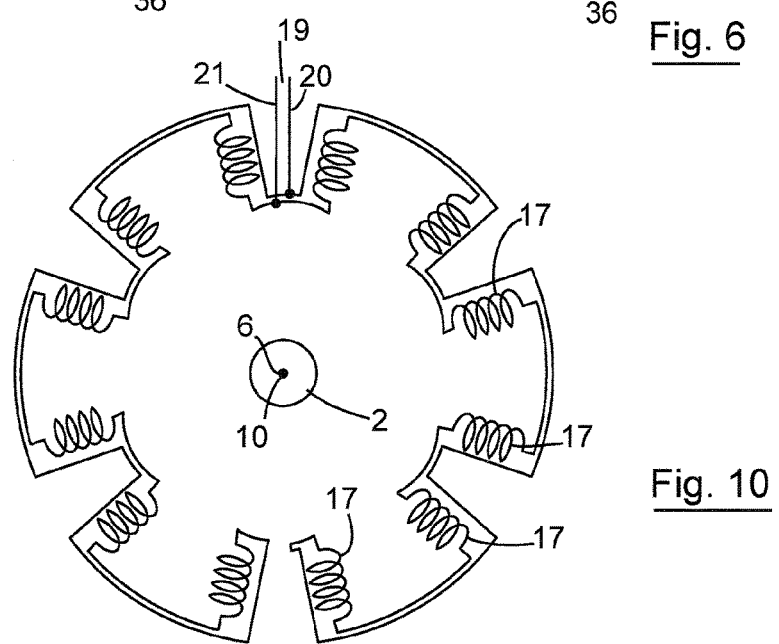
Figure 7:
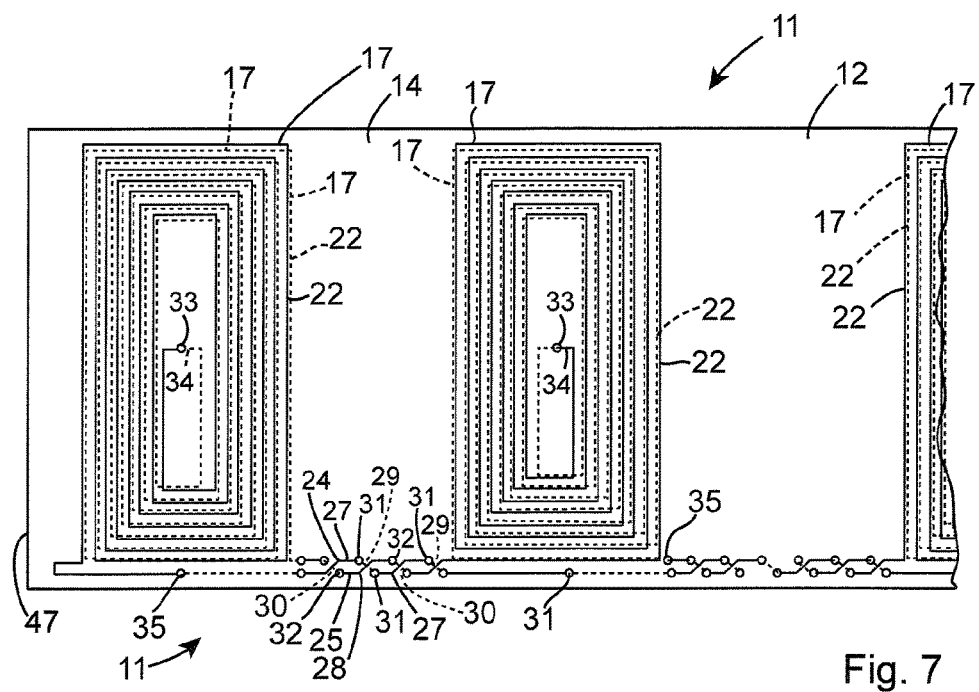
Figure 8:
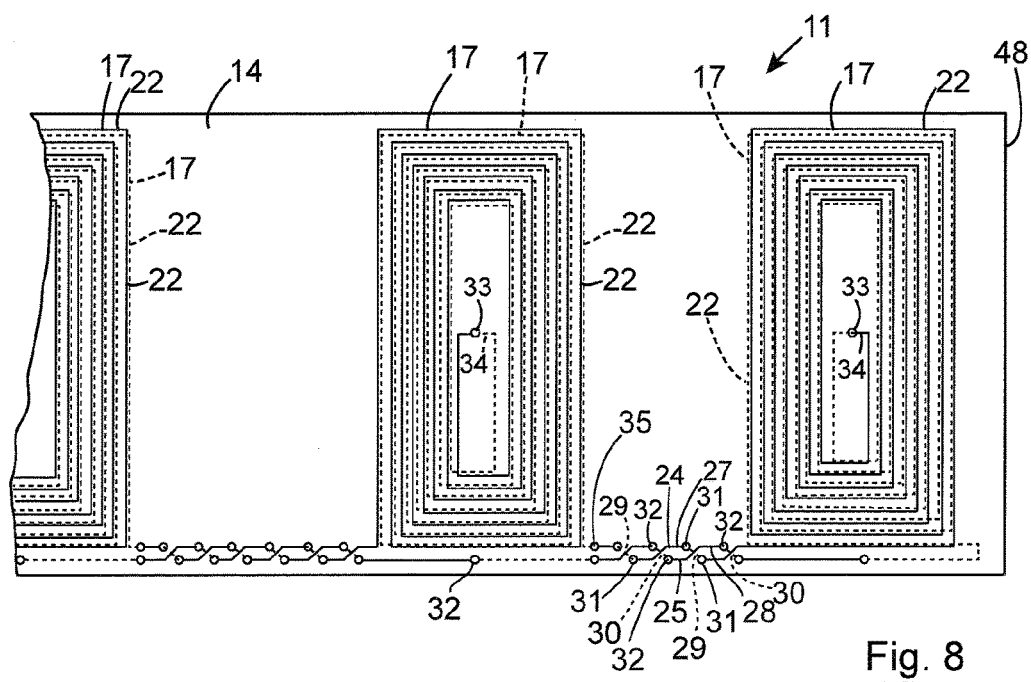
Figure 15:
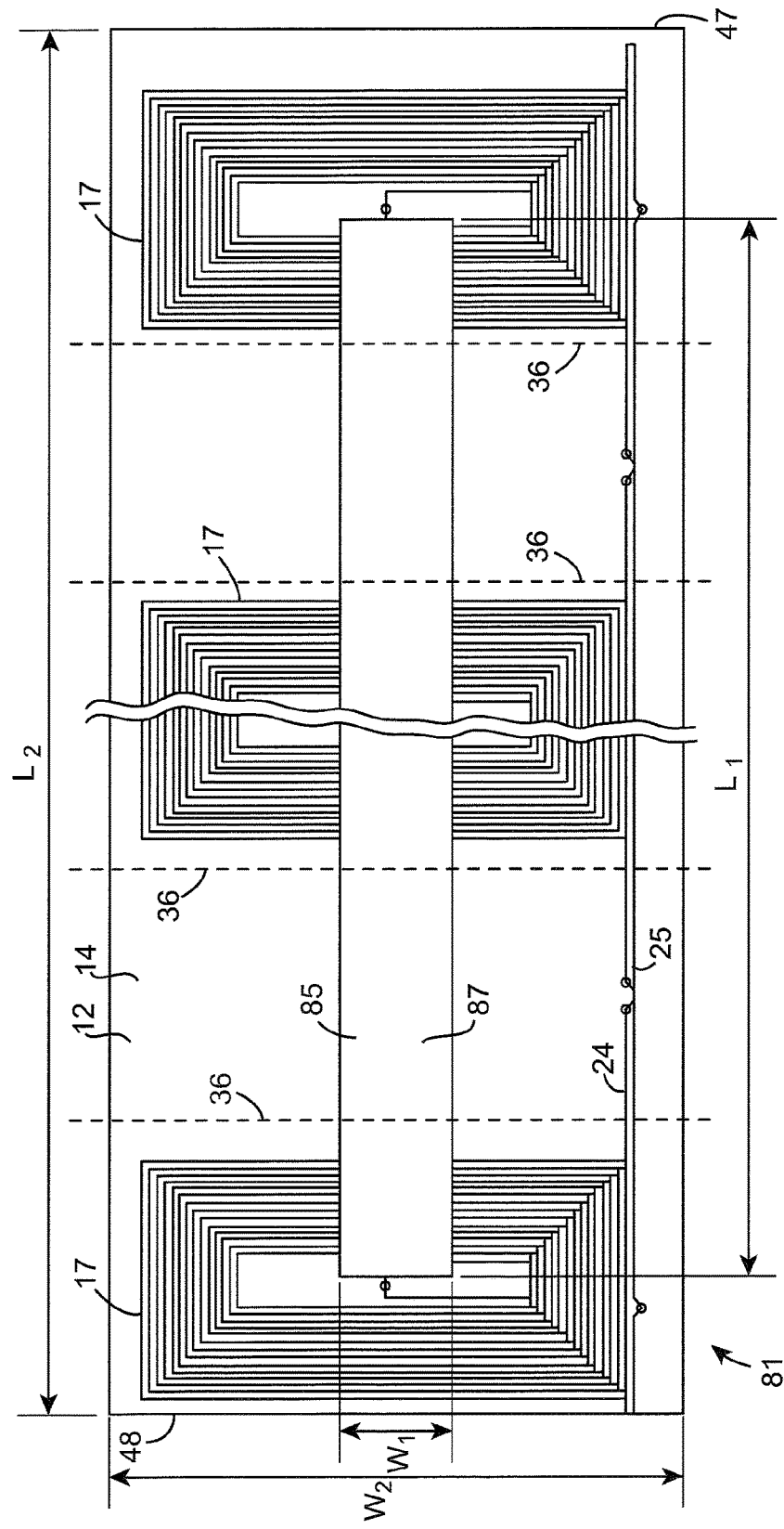
Figure 16:
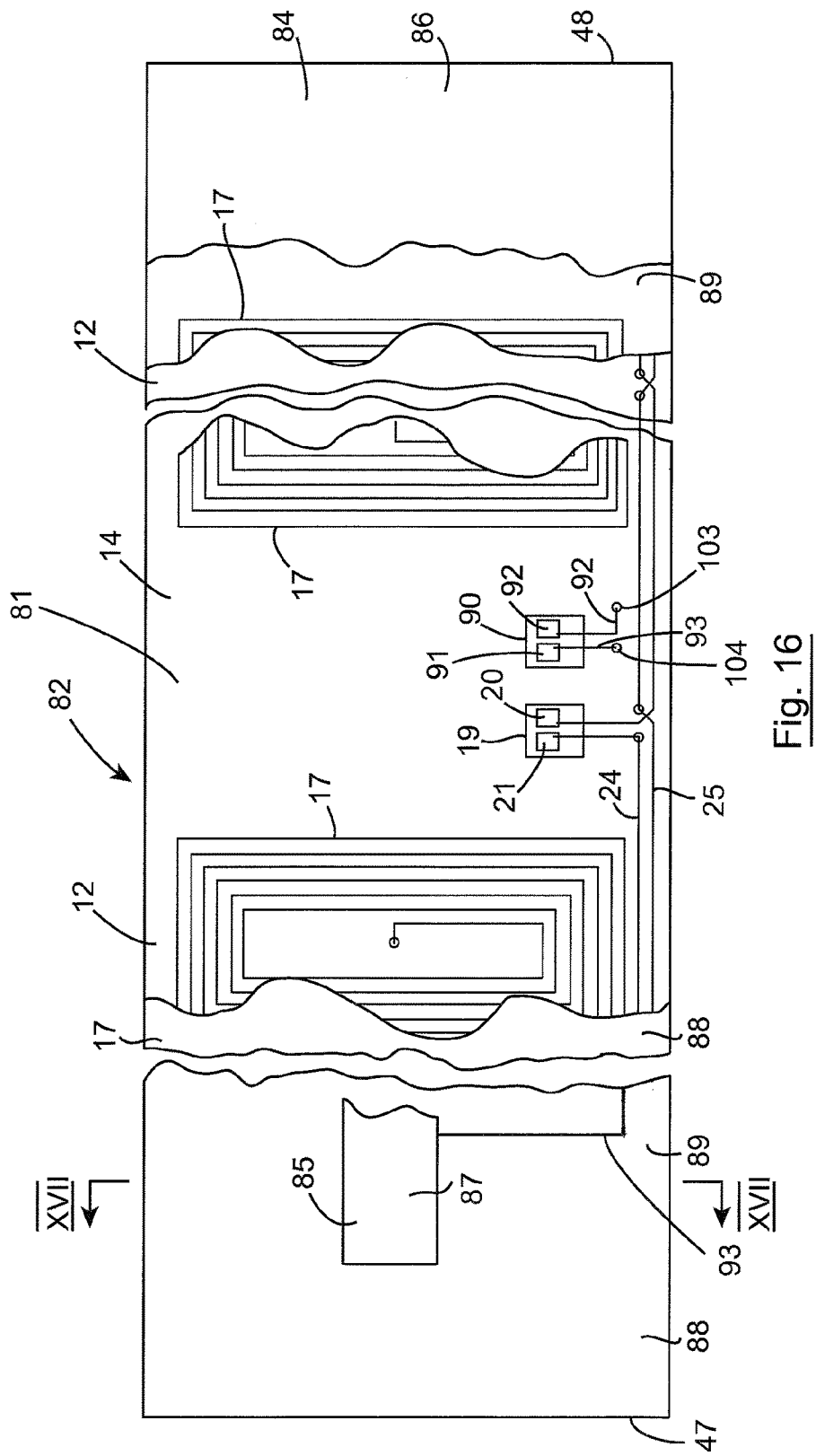

The invention will be more clearly understood from the following description of some preferred embodiments thereof, which are given by way of example only, with reference to the accompanying drawings which are not to scale, in which:

FIG. 1 is a perspective view of a current sensing device according to the invention for producing a signal indicative of the magnitude of an alternating current flowing in a conductor, FIG. 2 is another perspective view of the current sensing device of FIG. 1, FIG. 3 is a perspective view of the current sensing device of FIG. 1 from the other side to that of FIGS. 1 and 2, FIG. 4 is a front elevational view of the current sensing device of FIG. 1, FIG. 5 is a cutaway perspective view of the current sensing device of FIG. 1, FIG. 6 is a perspective view of a carrier element also according to the invention of the current sensing device of FIG. 1, FIG. 7 is a plan view of a developed portion of the carrier element of FIG. 6, FIG. 8 is a view similar to FIG. 7 of another developed portion of the carrier element of FIG. 6, FIG. 9 is a view similar to FIG. 7 of another developed portion of the carrier element of FIG. 6, FIG. 10 is a schematic diagrammatic view of the current sensing device of FIG. 1, FIG. 11 is a block representation of a circuit for use with the current sensing device of FIGS. 1 to 10 for determining the magnitude of an alternating current flowing in a conductor, FIG. 12 is a cutaway plan view of a carrier element according to another embodiment of the invention for use in a current sensing device also according to another embodiment of the invention, FIG. 13 is a cross-sectional end view of the carrier element of FIG. 11 on the line XIII-XIII of FIG. 12, FIG. 14 is a perspective view of a current sensing device according to another embodiment of the invention, FIG. 15 is a plan view of a portion of the current sensing device of FIG. 14, FIG. 16 is a cutaway plan view of the portion of FIG. 15 of the current sensing device of FIG. 14, FIG. 17 is a cross-sectional end elevational view of the portion of FIG. 15 of the current sensing device of FIG. 14 on the line XVII-XVII of FIG. 16, FIG. 18 is a block diagram of a signal processing circuit for use with the current sensing device of FIG. 14 for detecting imbalance current and the direction of imbalance current in a conductor of a three-phase alternating current system, FIG. 19 is a front elevational view of a current sensing device according to another embodiment of the invention, FIG. 20 is a plan view of a portion of the current sensing device of FIG. 19, FIG. 21 is a cross-sectional end elevational view of the portion of FIG. 20 of the current sensing device of FIG. 19 on the line XXI-XXI of FIG. 20, FIG. 22 is a front elevational view of a current sensing device according to another embodiment of the invention, FIG. 23 is a plan view of a portion of the current sensing device of FIG. 22, FIG. 24 is a cross-sectional end elevational view of the portion of FIG. 23 of the current sensing device of FIG. 22 one the line XXIV-XXIV of FIG. 23, FIG. 25 is a cutaway plan view of a carrier element according to another embodiment of the invention for use in a current sensing device also according to the invention, FIG. 26 is a cross-sectional end elevational view of the carrier element of FIG. 25 on the line XXVI-XXVI of FIG. 25, FIG. 27 is a front elevational view of a voltage sensing device according to the invention, FIG. 28 is a plan view of a portion of the voltage sensing device of FIG. 27, FIG. 29 is a cross-sectional end elevational view of the portion of FIG. 28 of the voltage sensing device of FIG. 27 on the line XXIX-XXIX of FIG. 28, FIG. 30 is a front elevational view of a voltage sensing device according to another embodiment of the invention, FIG. 31 is a plan view of a portion of the current sensing device of FIG. 30, FIG. 32 is a cross-sectional end elevational view of the portion of FIG. 31 on the line XXXII-XXXII of FIG. 31, FIG. 33 is a front elevational view of a current sensing device according to another embodiment of the invention, FIG. 34 is a plan view of a portion of the current device of FIG. 33, and FIG. 35 is a cross-sectional end elevational view of the portion of FIG. 34 of the current sensing device of FIG. 33 on the line XXXV-XXXV of FIG. 34.

Referring to the drawings, and initially to FIGS. 1 to 11 thereof, there is illustrated a current sensing device according to the invention, indicated generally by the reference numeral 1, for mounting on a conductor 2 and for producing an output signal indicative of the magnitude of an alternating current flowing in the conductor 2. In this embodiment of the invention the output signal is proportional to the magnitude of the alternating current flowing in the conductor 2. The current sensing device 1 is particularly suitable for retrofitting onto a conductor. The current sensing device comprises a support element 5 of an electrically non-conductive material, which in this embodiment of the invention is an electrically insulating plastics material. The support element 5 is of solid but flexible annular construction defining a main central axis 6 and a central opening 8 extending axially therethrough for accommodating the conductor 2 through the support element 5.

In this embodiment of the invention the support element 5 is radially split by a radial slit 9 extending radially through the support element 5 from the central opening 8 to an outer peripheral surface 7 of the support element 5 for facilitating retrofitting the support element 5 onto the conductor 2. The plastics material of the support element 5 is sufficiently resilient to allow axial twisting or circumferential bending of respective portions of the support element 5 adjacent the radial slit 9 in order to accommodate the conductor 2 into the central opening 8 through the radial slit 9. When mounted on the conductor 2, the main central axis 6 defined by the support element 5 may or may not coincide with a central axis 10 of the conductor 2. Whether or not the axes 6 and 10 coincide will depend on the diameter of the central opening 8 of the support element 5 and the outer diameter of the conductor 2, and if the conductor 2 is insulated, the outer diameter of the insulation. However, it is not essential that the main central axis 6 of the support element 5 should coincide with the central axis 10 of the conductor 2.

A carrier comprising a carrier element also according to the invention, indicated generally by the reference numeral 11, is located in the support element 5 and comprises a carrier means which is provided by an elongated primary substrate 12 defining opposite first and second major surfaces 14 and 15. The primary substrate 12 is configured into an arcuate multi-channel configuration defining a plurality of adjacent channels 13 extending parallel to the main central axis 6, see FIG. 6. Side walls 16 of the channels 13 are retained in the support 5 to lie in respective planes extending substantially along and substantially radially from the main central axis 6 of the support element 5. The side walls 16 are equi-spaced apart circumferentially around the main central axis 6 of the support element 5.

A plurality of planar coils 17 are formed on the respective first and second major surfaces 14 and 15 on opposite sides of the side walls 16 of the primary substrate 12. With the primary substrate 12 so configured and located in the support element 5, the planar coils 17 define planes which extend substantially longitudinally along and substantially radially from the main central axis 6 and are spaced apart circumferentially around the main central axis 6 of the support element 5. Since the side walls 16 are equi-spaced apart circumferentially around the main central axis 6, the coils 17 on the first major surface 14 of the primary substrate are likewise equi-spaced apart circumferentially around the main central axis 6, as are the coils 17 on the second major surface 15 also equi-spaced apart circumferentially around the main central axis 6. The coils 17 on the respective first and second major surfaces 14 and 15 are connected in series so that voltages induced in the coils 17 by an alternating current flowing in the conductor 2 are summed in phase. A first output port 19 formed on the primary substrate 12 comprises a pair of terminals 20 and 21 between which the coils 17 are series connected in order to produce a voltage signal which is the sum of the voltages induced in the coils 17. The voltage signal produced on the first output port 19 is the signal which is indicative of the alternating current flowing in the conductor 2, and which when integrated with respect to time produces an output signal which is proportional to the magnitude of the alternating current flowing in the conductor 2.

The primary substrate 12 is of a flexible bendable electrically insulating material, which in this embodiment of the invention is a plastics material such as polyimide or other similar substrate material and which in this case is PEEK material. The primary substrate 12 is suitable for facilitating the formation of the planar coils 17 by electrically conductive tracks 22 on the first and second major surfaces 14 and 15 thereof. The electrically conductive tracks 22 may be formed by any suitable process, for example, metal deposition, such as metal sputtering, or by etching from respective electrically conductive layers formed on the first and second major surfaces 14 and 15 of the primary substrate 12.

The coils 17 on the respective first and second major surfaces 14 and 15 of the primary substrate 12 are series connected by electrically conductive tracks 24 and 25 which are formed on the first and second surfaces 14 and 15 as twisted pairs, for minimising external electrical magnetic interference. The electrically conductive tracks 24 and 25 are formed by a similar process to that used for forming the electrically conductive tracks 22 of the coils 17 and terminate in the terminals 20 and 21, respectively, of the first output port 19. In FIGS. 7 to 9 the electrically conductive tracks 22 of the planar coils 17 on the first major surface 14 are shown in continuous lines, and the electrically conductive tracks 22 of the planar coils 17 on the second major surface 15 are illustrated by broken lines. Similarly, segments 27 and 28 of the electrically conductive tracks 24 and 25, respectively, which are formed on the first major surface 14 are illustrated as continuous lines, while segments 29 and 30 of the electrically conductive tracks 24 and 25, respectively, which are formed on the second major surface 15 are illustrated by broken lines. Vias 31 through the primary substrate 12 connect the segments 27 and 29 of the electrically conductive track 24 through the primary substrate 12, while vias 32 extending through the primary substrate 12 connect the segments 28 and 30 of the electrically conductive track 25 through the primary substrate 12. Vias 33 extending through the primary substrate 12 connect inner ends 34 of each pair of adjacent coils 17 on the first and second major surfaces 14 and 15 through the primary substrate 12. Outer ends 35 of the coils 17 are connected to the appropriate one of the electrically conductive tracks 24 and 25. The windings of the coils 17 and the connections of the outer ends 35 of the coils 17 to the electrically conductive tracks 24 and 25 are configured so that the voltages induced in the coils 17 by the alternating current flowing in the conductor 2 are summed in phase on the output terminals 20 and 21 of the first output port 19.

The primary substrate 12 is initially provided as an elongated primary substrate, and the coils 17 are formed on the first and second major surfaces 14 and 15 at spaced apart intervals. The coils 17 on the second major surface 15 are formed adjacent the corresponding coils 17 on the first major surface 14, so that when the primary substrate is configured into the multi-channel configuration illustrated in FIG. 6, the coils 17 are located on opposite sides of the side walls 16 of the channels 13 with the coil axes of adjacent coils aligned with each other.

After forming the coils 17 and the electrically conductive tracks 24 and 25 which connect the coils 17 in series on the primary substrate 12, the primary substrate 12 is formed into the multi-channel configuration by bending the primary substrate 12 along transversely extending lines 36, which when the primary substrate 12 is located in the support element 5 extend substantially parallel to the main central axis 6 of the support element 5. Bending the primary substrate 12 along the transversely extending lines 36 forms the primary substrate 12 into the multi-channel configuration with the parallel channels 13, and the coils 17 being located on opposite sides of the side walls 16 of the channels 13. The channels 13 define respective open mouths 37, and the open mouths 37 of alternative ones of the channels 13 extend in respective opposite directions.

The primary substrate 12 in the multi-channel configuration is then further configured into an arcuate configuration to substantially define a cylinder, so that when the primary substrate 12 is located in the support element 5, the primary substrate 12 extends around the main central axis 6 of the support element 5 with the side walls 16 of the channels 13 and in turn the corresponding coils 17 defining respective planes which extend substantially longitudinally along and substantially radially outwardly from the main central axis 6 of the support element 5. The first major surface 14 of the primary substrate 12 in the multi-channel arcuate configuration faces inwardly towards the main central axis 6 of the support element 5, while the second major surface 15 faces outwardly.

A primary retaining recess 38 which substantially defines the primary substrate 12 in the multi-channel arcuate configuration is formed in and extends longitudinally into the support element 5 for locating and retaining the primary substrate 12 in the multi-channel arcuate configuration therein. The primary retaining recess 38 is formed by a plurality of spaced apart circumferentially extending outer recesses 40, and a plurality of spaced apart circumferentially extending inner recesses 41, which are joined by circumferentially equi-spaced apart radially extending radial recesses 42. The inner and outer circumferential recesses 40 and 41 and the radial recesses 42 extend longitudinally into the support element 5 from one end face 45 thereof, and extend longitudinally relative to the main central axis 6 of the support element 5. The inner and outer recesses 40 and 41 and the radial recesses 42 are sized and configured to correspond with the primary substrate 12 in the multi-channel arcuate configuration for receiving and retaining the primary substrate 12 in the multi-channel arcuate configuration within the support element 5 extending around the main central axis 6 of the support element 5 with the coils 17 defining the corresponding planes which extend substantially longitudinally along the main central axis 6 and substantially radially outwardly therefrom. Since the coils 17 are provided on the first and second major surfaces 14 and 15 of the primary substrate 12, when the primary substrate 12 is located in the primary retaining recess 38 of the support element 5, the coils 17 on the first major surface 14 of the primary substrate 12 are equi-spaced apart circumferentially around the main central axis 6, and the coils 17 which are located on the second major surface 15 of the primary substrate 12 are equi-spaced apart circumferentially around the main central axis 6.

Respective opposite ends 47 and 48 of the primary substrate 12 terminate adjacent radial faces 50 and 51, respectively, of the support element 5 defined by the radial slit 9 in the support element 5. A plug portion 53 extending from the radial face 50 of the support element 5 is engageable with a socket 54 located in the radial face 51 of the support element 5 for locating and aligning the radial faces 50 and 51 with each other adjacent the radial slit 9 when the support element 5 is fitted onto the cable 2.

A primary recess 55 in the end face 45 of the support element 5 provides access to the first output port 19 for making a connection to the terminals 20 and 21 of the first output port 19.

A lug 56 extending from the support element 5 is provided with a bore 57 for accommodating a cable tie or other suitable fixing element for securing the device 1 onto the conductor 2 with the conductor 2 extending through the central opening 8 of the support element 5, and substantially coaxial therewith.

In use, with the primary substrate 12 in the multi-channel arcuate configuration located in the support element 5, adjacent ends of the support element 5 adjacent the radial slit 9 are urged in opposite axial directions, namely, in the directions of the arrows A and B, see FIGS. 1 and 2 in order to form a gap between the radial faces 50 and 51 of the support element 5 to accommodate the conductor 2 through the gap into the central opening 8 defined by the support element 5. Once the conductor 2 is located in the central opening 8, the ends of the support element 5 adjacent the radial slit 9 are returned so that the radial faces 50 and 51 of the support element 5 again abut each other with the plug portion 53 extending from the radial face 50 engaging the socket 54 in the radial face 51. A cable tie or a suitable spring clip, neither of which are shown, is passed through the bore 57 in the lug 56 and is secured to the conductor 2 to secure the device 1 to the conductor 2, with the conductor 2 extending through the bore 8 of the support element 5.

Referring now to FIG. 11, a signal processing circuit 60 is illustrated which produces a signal proportional to the alternating current flowing in the conductor 2 from the voltage signal produced on the first output terminal 19 of the current sensing device 1 which is illustrated in block representation in FIG. 11. The signal processing circuit 60 comprises an integrating amplifier 61 which integrates the voltage signal produced on the first output port 19 of the current sensing device 1 with respect to time to produce the output voltage on an output terminal 62 which is proportional to the magnitude of the amplitude of the alternating current flowing through the conductor 2. Integrating the voltage signal which appears on the terminals 20 and 21 of the first output port 19 with respect to time produces a signal which is proportional to the magnitude of the amplitude of the alternating current flowing in the conductor 2, since the voltage produced across the terminals 20 and 21 is equal to the sum of the voltages induced in the coils 17 and is thus proportional to the differential of the current flowing through the conductor 2.

Referring now to FIGS. 12 and 13, there is illustrated a carrier element according to another embodiment of the invention, indicated generally by the reference numeral 70, of a current sensing device according to another embodiment of the invention, which is not illustrated but is substantially similar to the current sensing device 1 which has been described with reference to FIGS. 1 to 11. The carrier element 70 of this embodiment of the invention is substantially similar to the carrier element 11 described with reference to FIGS. 1 to 11, and similar components are identified by the same reference numerals. In this embodiment of the invention a shielding means comprising an electrically conductive shield 71 formed by an electrically conductive shielding panel 72 is located on the second major surface 15 of the primary substrate 12 for minimising the effect of external stray electric fields on the coils 17 and also for filtering out magnetic fields of relatively high frequency greater than 20 KHz. The shielding panel 71 is electrically insulated from the coils 17 on the second major surface 15 by a layer 73 of electrically insulating material formed on the second major surface 15 of the primary substrate 12 over the coils 17. The layer 73 of electrically insulating material may be provided on the primary substrate 12 over the coils 17 by any suitable method. The shielding panel 71 may be formed on the electrically insulating layer 73 by any suitable method, for example, metal deposition, metal sputtering or the like. The area of the shielding panel 71 is substantially similar to the area of the primary substrate 12. A via (not shown) through the insulating layer 73 and through the primary substrate 12 accommodates an electrically conductive track (not shown) from the shielding panel 72 to a third terminal (also not shown) in the first output port (not shown), but which is substantially similar to the first output port 19 of the current sensing device 1, so that the shielding panel 71 can be connected to ground to form a ground plane for minimising the effect of any external stray electric fields on the coils 17, and also to filter out magnetic fields of relatively high frequency greater than 20 KHz.

In use, the primary substrate 12 of the carrier element 70 with the coils 17 and the shielding panel 71 formed thereon is formed into the multi-channel arcuate configuration described with reference to the carrier element 11 of the current sensing device 1. The multi-channel arcuate configured primary substrate 12 is inserted into the primary retaining recess 38 in the support element 5 as already described with reference to the current sensing device 1. The primary substrate 12 is inserted in the primary retaining recess 38 with the first major surface 14 of the primary substrate 12 facing towards the main central axis 6 of the support element 5 and with the second major surface 15 of the primary substrate 12 facing outwardly from the main central axis 6, with the shielding panel 72 remote from the main central axis 6.

Otherwise, the carrier element 70 and its use in the current sensing device according to this embodiment of the invention, which is not illustrated, is similar to that of the carrier element 11 of the current sensing device 1, with the exception that in addition the effect of external stray electric fields on the coils 17 is minimised by the shielding panel 72, which also filters out magnetic fields of relatively high frequencies greater than 20 KHz.

Referring now to FIGS. 14 to 17, there is illustrated a current sensing device according to another embodiment of the invention, indicated generally by the reference numeral 80. The current sensing device 80 is substantially similar to the current sensing device 1, and similar components are identified by the same reference numerals. However, in this embodiment of the invention the current sensing device 80 as well as producing a signal indicative of the magnitude of the amplitude of an alternating current flowing in a conductor 2, the current sensing device 80 is also adapted to produce a signal indicative of the magnitude of the amplitude of an alternating voltage in the conductor 2. The support element 5 of the current sensing device 80 is similar to the support element 5 of the current sensing device 1. In this embodiment of the invention a carrier element 81 which is located in and retained in the primary retaining recess 38 of the support element 5 in the multi-channel arcuate configuration is similar to the carrier element 11 of the current sensing device 1 with the exception that a voltage sensing means is provided on the carrier element 81. The voltage sensing means comprises a capacitor 82 which is located on the carrier element 81.

The carrier element 81 comprises a primary substrate 12 similar to the primary substrate 12 of the carrier element 11 onto which planar coils 17 similar to the planar coils 17 of the carrier element 11 are formed on respective opposite first and second major surfaces 14 and 15 of the primary substrate 12 of the carrier element 81. First and second electrically conductive capacitor plates 84 and 85 of the capacitor 82 are formed by first and second electrically conductive panels 86 and 87 which are located on the second and first major surfaces 15 and 14, respectively, of the primary substrate 12 over the planar coils 17. A first electrically insulating layer 88 is provided on the first major surface 14 of the primary substrate 12 over the planar coils 17 between the coils 17 and the second capacitor plate 85 in order to electrically insulate the second capacitor plate 85 from the adjacent coils 17. A second electrically insulating layer 89 is provided on the second major surface 15 of the primary substrate 12 over the planar coils 17 between the coils 17 and the first capacitor plate 84, in order to electrically insulate the first capacitor plate 84 from the adjacent coils 17. The first and second electrically insulating layers 88 and 89 and the primary substrate 12 act as a dielectric between the first and second capacitor plates 84 and 85 to form the capacitor 82.

The first major surface 14 of the primary substrate 12 and the second capacitor plate 85 face inwardly towards the main central axis 6 of the support element 5, while the second major surface 15 of the primary substrate 12 and the first capacitor plate 84 face outwardly from the main central axis 6. In other words, the second capacitor plate 85 is located between the first capacitor plate 84 and the main central axis 6 when the carrier element 81 is inserted in the primary retaining recess 38 of the support element 5.

The first capacitor plate 84 which is located adjacent the second major surface 15 of the primary substrate 12 is coupled to ground and is of area substantially similar to the area of the second major surface 15 of the primary substrate 12. The first capacitor plate 84 thus forms a ground plane. The area of the second capacitor plate 85 which is located adjacent the first major surface 14 of the primary substrate 12 is of area less than the area of the first capacitor plate 84, so that the first capacitor plate 84 which forms a ground plane minimises the effect of external stray electric fields on the second capacitor plate 85, since the first capacitor plate 84 is located adjacent the second major surface 15 of the primary substrate 12 which faces outwardly relative to the main central axis 6 of the support element 5. Additionally, the first capacitor plate 84 also acts to filter out magnetic fields of relatively high frequency greater than 20 KHz. By minimising the effect of external stray electric fields on the second capacitor plate 85, the effect of such external stray electric fields on the capacitor 82 is minimised. In this embodiment of the invention the second electrically conductive panel 87 of the second capacitor plate 85 is substantially centred relative to the first electrically conductive panel 86 of the first capacitor plate 84.

The length $L_1$ of the second electrically conductive panel 87 in the general circumferential direction relative to the main central axis 6 of the support element 5 is approximately 97% of the length $L_2$ of the first electrically conductive panel 86 in the generally circumferential direction. The width $W_1$ of the second electrically conductive panel 87 in a general longitudinal direction relative to the main central axis 6 of the support element 5 is approximately 22% of the width $W_2$ of the first electrically conductive panel 6 in the general longitudinal direction.

A second output port 90 is provided on the primary substrate 12 on the first major surface 14 thereof and comprises terminals 91 and 92 which are electrically coupled to the first and second electrically conductive panels 86 and 87 by electrically conductive tracks 93 and 94, respectively. A via 103 through the primary substrate 12 and the second insulating layer 89 accommodates the track 93 from the first electrically conductive panel 86 to the terminal 91, and a via 104 through the first insulating layer 88 accommodates the track 94 from the second electrically conductive panel 87 to the terminal 92. The terminal 91 which is coupled to the first electrically conductive panel 86 is coupled to ground, so that the first capacitor plate 84 forms the negative plate of the capacitor 82 and also forms a ground plane to minimise the effects of external stray electric and magnetic fields on the capacitor 82. The voltage signal which is developed across the first and second capacitor plates 84 and 85 of the capacitor 82 and which is indicative of the alternating voltage in the conductor 2 is produced across the terminals 91 and 92 of the second output port 90. The recess 55 formed in the support element 5 in the end face 45 also provides access to the second output port 90.

The primary substrate 12 of the carrier element 81 with the coils 17, the first and second electrically conductive panels 86 and 87 and the electrically conductive tracks 24 and 25 formed thereon together with the first and second outputs 19 and 90 also formed thereon is formed into the multi-channel arcuate configuration, and is then inserted into the primary retaining recess 38 in the support element 5 and is thus ready for locating on a conductor 2, with the conductor 2 extending longitudinally through the central opening 8 in the support element 5.

Referring now to FIG. 18, a signal processing circuit, indicated generally by the reference numeral 95, is illustrated for detecting imbalance current and the direction of the imbalance current in a three-phase alternating current network. In this embodiment of the invention to determine the imbalance current and the direction of the imbalance current in the three-phase alternating current network, three of the current sensing devices 80 are required, one for each of the conductors carrying the phases of the three-phase system. The circuit 95 comprises a first summing stage 96 to which the voltage signals indicative of the magnitudes of the alternating currents flowing in the three conductors of the three phase network from the first output ports 19 of the current sensing devices 80 are applied and summed. The summed output voltage from the first summing stage 96 is then applied to a first logic output zero crossing comparator 97 which produces a logic square wave signal, which is representative of the phase of the imbalance current.

A second summing stage 98 to which the voltage signals indicative of the amplitudes of the alternating voltages in the respective conductors of the three phase network from the second output ports 90 of the current sensing devices 80 are applied for summing thereof. The summed output voltage from the second summing stage 98 is applied to a second logic zero crossing comparator 99, which also produces a square wave logic output signal representative of the phase of the voltage of the imbalance current.

A circuit 100 analyses the logic signal from the first comparator 97 and the logic signal from the second comparator 99 in order to determine whether the logic signal from the first comparator 97 which is representative of the phase of the imbalance current is leading or lagging the logic signal from the second comparator 99 which is representative of the phase of the voltage of the imbalance current. When the logic signal from the first comparator 96 is leading the logic signal from the second comparator 99, this is indicative of the phase of the imbalance current leading the phase of the voltage in the conductors of the three-phase network to which the current sensing devices 80 are attached. When the logic signal from the first comparator 96 lags the logic signal from the second comparator 99, this is indicative of the phase of the imbalance current lagging the phase of the voltage in the conductors of the three-phase network to which the current sensing devices 80 are attached.

The circuit 100 outputs a logic high on an output terminal 101 when the phase of the imbalance current is leading the phase of the voltage in the conductors of the three-phase network, and the circuit 100 outputs a logic low on the output terminal 101 when the phase of the imbalance current is lagging the phase of the voltage in the conductors of the three-phase network. The leading and lagging logic signals on the output terminal 101 are representative of the direction of flow of the imbalance current in the conductors of the three-phase network. The value of the imbalance current level is derived from a separate signal processing circuit, which will be well known and understood by those skilled in the art.

Referring now to FIGS. 19 to 21, there is illustrated a current sensing device also according to the invention and indicated generally by the reference numeral 110. The current sensing device 110, like the current sensing device 80, also as well as producing a signal indicative of the magnitude of an alternating current flowing in a conductor, also produces a signal which is indicative of the magnitude of the alternating voltage in a conductor, and is therefore also suitable for detecting an imbalance current in a multi-phase alternating current network, and the direction of flow of the imbalance current by using the appropriate number of current sensing devices 110, namely, one current sensing device for each conductor of the multi-phase alternating current network. The current sensing device 110 is substantially similar to the current sensing device 1 which has been described with reference to FIGS. 1 to 11, and similar components are identified by the same reference numerals. In this embodiment of the invention the support element 5 is substantially similar to the support element 5 of the current sensing device 1 and the carrier element 11 is similar to the carrier element 11 of the current sensing device 1.

However, in this embodiment of the invention a capacitor 112 for producing a signal indicative of the magnitude of the alternating voltage in a conductor 2 is provided on a secondary substrate 114 which is also located in the support element 5 extending around the inner side of the carrier element 11, in other words, between the carrier element 11 and the main central axis 6 of the support element 5. The capacitor 112 comprises a first capacitor plate 115 and a second capacitor plate 116 with the secondary substrate 114 forming a dielectric therebetween. The first capacitor plate 115 comprises a first electrically conductive panel 117 formed on a first major surface 118 of the secondary substrate 114. The second capacitor plate 116 comprises a second electrically conductive panel 120 formed on a second major surface 121 of the secondary substrate 114. The secondary substrate 114 is of an electrically insulating material and forms the dielectric between the first and second electrically conductive panels 117 and 120.

The secondary substrate 114 is of area less than the area of the primary substrate 12, since the secondary substrate 114 is not formed into a multi-channel configuration. The secondary substrate 114 is merely formed into an arcuate configuration which is substantially cylindrical and is retained in the arcuate configuration in a cylindrical secondary retaining recess 123 which is formed in the support element 5 and extends around the support element 5 on the inner side of the primary retaining recess 38. The secondary retaining recess 123 extends from the face 45 longitudinally into the support element 5 relative to the main central axis 6 thereof.

The first electrically conductive panel 117 is of area similar to the area of the first major surface 118 of the secondary substrate 114 and is grounded to form a ground plane. The area of the second electrically conductive panel 120 is less than the area of the first electrically conductive panel 117 so that the grounded first electrically conductive panel 117 which is located on the outer side of the secondary substrate 114 minimises the effect of external stray electric fields on the second electrically conductive panel 120, and thus minimises the effect of external stray electric fields on the capacitor 112. The first electrically conductive panel 117 also filters out external stray magnetic fields of relatively high frequency greater than 20 KHz.

The second electrically conductive panel 120 is centred relative to the first electrically conductive panel 117 and is of length $L_1$ in a generally circumferential direction relative to the main central axis 6 of approximately 97% of the length $L_2$ of the first electrically conductive panel 117 in the generally circumferential direction. The width $W_1$ of the second electrically conductive panel 120 in a generally longitudinal direction relative to the main central axis 6 is approximately 22% of the width $W_2$ of the first electrically conductive panel 117 in the general longitudinal direction.

A second output port 125 located on the secondary substrate 114 comprises terminals 126 and 127 formed on the second major surface 121 of the secondary substrate 114, and which are connected to the first and second electrically conductive panels 117 and 120 by electrically conductive tracks 122 and 124, respectively, formed on the second major surface 121 of the secondary substrate 114. The track 122 is accommodated from the first electrically conductive panel 117 to the terminal 126 through a via 128 extending through the secondary substrate 114. The voltage indicative of the magnitude of the alternating voltage in the conductor 2 is produced across the terminals 126 and 127 of the secondary output port 125. The terminal 126 is coupled to ground so that the first electrically conductive panel 117 forms the ground plane to minimise the effect of external stray electric fields and high frequency magnetic fields on the second electrically conductive panel 120 for in turn minimising the effect of such external stray electrical and high frequency magnetic fields on the capacitor 112.

The carrier element 11 is located in the primary retaining recess 38 of the support element 5 and the secondary substrate 114 is located in the secondary retaining recess 123. A secondary recess 129 in the support element 5 adjacent the end face 45 thereof provides access to the second output port 125 of the secondary substrate of the capacitor 112.

In use, the current sensing device 110 is engaged on the conductor 2 with the conductor extending longitudinally through the central opening 8 of the support element 5. Use of the current sensing device 110 is similar to that of the current sensing device 80 for determining current and voltage flowing in a conductor and for determining imbalance current in a single phase or a multi-phase alternating current network in which an alternating current is flowing, and the direction of flow of the imbalance current.

Referring now to FIGS. 22 to 24, there is illustrated a current sensing device according to the invention, indicated generally by the reference numeral 130. The current sensing device 130 is substantially similar to the current sensing device 1 described with reference to FIGS. 1 to 11, and similar components are identified by the same reference numerals. However, in this embodiment of the invention the current sensing device 130, as well as producing a signal indicative of the magnitude of the amplitude of an alternating current flowing in a conductor 2, the current sensing device 130 is also adapted to produce a signal indicative of the magnitude of the amplitude of an alternating voltage in the conductor 2. The support element 5 of the current sensing device 130 is similar to the support element 5 of the current sensing device 1. In this embodiment of the invention the carrier element 11 is similar to the carrier element 11 of the current sensing device 1.

However, in this embodiment of the invention the voltage sensing means is provided by a capacitor 131 which is formed on a secondary substrate 132 by first and second capacitor plates 134 and 135, respectively, which are located on and formed on first and second major surfaces 137 and 138, respectively, of the secondary substrate 132. The secondary substrate 132 and the first and second capacitor plates 134 and 135 are substantially similar to the secondary substrate 114 and the first and second capacitor plates 115 and 116 of the capacitor 112 of the current sensing device 110 which is described with reference to FIGS. 19 to 21. The only difference between the secondary substrate 131 and the first and second capacitor plates 134 and 135 of the capacitor 131 and the secondary substrate 114 and the first and second capacitor plates 115 and 116 of the capacitor 112 is that the secondary substrate 132 and the first and second capacitor plates 134 and 135 are longer than the secondary substrate 114 and the first and second capacitor plates 115 and 116 so that the secondary substrate 132 can be configured into a multi-channel arcuate configuration similar to the multi-channel arcuate configuration of the carrier element 11.

In this embodiment of the invention the secondary substrate 132 is of a suitable flexible dielectric material, so that the secondary substrate 132 and the first and second capacitor plates 134 and 135 can be bent along transversely extending lines 139 which extend transversely across the secondary substrate 132 so that the secondary substrate 132 when bent along the lines 139 is configured into the multi-channel configuration. In this embodiment of the invention the carrier element 11 and the secondary substrate 132 are both inserted into the primary retaining recess 38 in the support element 5 and are both retained in the multi-channel arcuate configuration in the primary retaining recess 38 with the secondary substrate 132 forming the capacitor 131 located between the carrier element 11 and the main central axis 6 of the support element 5. An electrically insulating membrane is located in the primary retaining recess 38 between the primary and secondary substrates 12 and 132 in order to electrically insulate the first capacitor plate 134 from the coils 17 on the first major surface 14 of the primary substrate 12.

Otherwise, the current sensing device 130 and its use is similar to the current sensing device 110.

Referring now to FIGS. 25 and 26, there is illustrated a carrier element also according to the invention, indicated generally by the reference numeral 150, for use in a current sensing device (not shown) also according to the invention for producing a signal indicative of the magnitude of an alternating current flowing in a conductor. The carrier element 150 is substantially similar to the carrier element 70 described with reference to FIGS. 12 and 13, and similar components are identified by the same reference numerals. The only difference between the carrier element 150 and the carrier element 70 is that the carrier element is provided with a pair of electrically conductive shields 151 and 152, which are both similar to the electrically conductive shield 71 of the carrier element 70. The electrically conductive shield 151 is located adjacent the second major surface of the primary substrate 12 while the electrically conductive shield 152 is located adjacent the first major surface 14 of the primary substrate 12. First and second electrically insulating layers 154 and 155 are located between the electrically conductive shields 152 and 151, respectively, and the coils 17 on the respective first and second major surfaces 14 and 15 of the primary substrate 12. The electrically conductive shields 151 and 152 are of area substantially similar to the area of the primary substrate 12.

The shielding panels 151 and 152 are electrically coupled to each other through a via (not shown) through the primary substrate 12 and through the first and second insulating layers 154 and 155. An electrically conductive track (not shown) on the primary substrate 12 from the via (not shown) connects the conductive shields 151 and 152 to a third terminal (not shown) in the first output port 19 on the primary substrate 12. The third terminal (not shown) in use is connected to ground, so that the electrically conductive shields 151 and 152 form respective ground planes to thereby minimise the effect of external stray electrical fields and magnetic fields of relatively high frequency greater than 20 KHz on the coils 17.

In use, the carrier element 150 is folded into the multi-channel arcuate configuration and is inserted in a primary retaining recess 38 in one of the support elements 5.

Referring now to FIGS. 27 to 29, there is illustrated a voltage sensing device also according to the invention, indicated generally by the reference numeral 160, for producing a signal indicative of an alternating voltage in a conductor 2. The voltage sensing device 160 comprises a support element 161 which is substantially similar to the support element 5 of the current sensing device 1 described with reference to FIGS. 1 to 11, and similar components are identified by the same reference numerals. However, in this embodiment of the invention the support element 161 only supports a first capacitor 162 which extends substantially completely around the main central axis 6 defined by the support element 161.

The first capacitor 162 comprises a first substrate 164 which is substantially similar to the primary substrate 12 of the current sensing device 1, with the exception that the first substrate 164 is not configured into a multi-channel configuration, but rather is configured only into an arcuate configuration, which is substantially cylindrical. The first substrate 164 defines opposite first and second major surfaces 166 and 167. First and second capacitor plates 168 and 169, respectively, are formed on the first and second major surfaces 166 and 167, respectively, of the first substrate 164 with the first substrate 164 forming a dielectric between the first and second capacitor plates 168 and 169. The first substrate 164 is located in the support element 161 with the second capacitor plate 169 located between the first capacitor plate 168 and the main central axis 6. The first and second capacitor plates 168 and 169 comprise first and second electrically conductive panels 163 and 165, respectively, which are substantially similar to the first and second electrically conductive panels 117 and 120, respectively, of the capacitor 112 of the current sensing device 110, and are formed on the first and second major surfaces 166 and 167 of the first substrate 164 by metal deposition, etching and/or by any other suitable process.

The first capacitor plate 168 is of area substantially similar to the area of the first substrate 164, while the second capacitor plate 169 is of area less than the area of the first capacitor plate 168, and the second capacitor plate is substantially centred on the first substrate 164 relative to the first capacitor plate 168. The relationships between length and width dimensions of the second capacitor plate 169 relative to the first capacitor plate 168 are substantially similar to the relationships between the length and width dimensions of the first and second capacitor plates 115 and 116 of the capacitor 112 of the current sensing device 111 described with reference to FIGS. 19 to 21.

An output port 170 located on the second major surface 167 of the first substrate 164 comprises output terminals 171 and 172. The output terminal 171 is electrically coupled to the first capacitor plate 168 by an electrically conductive track 173 on the second major surface 167 of the first substrate 164 which communicates with the first capacitor plate 168 through a via 175 extending through the first substrate 164. The terminal 172 is coupled to the second capacitor plate 169 by an electrically conductive track 176 on the second major surface 167 of the first substrate 164. The voltage developed across the first and second capacitor plates 168 and 169 resulting from the alternating voltage in the conductor 2 is produced across the output terminals 171 and 172 of the output port 170 which is the signal indicative of the alternating voltage flowing in the conductor 2. The output terminal 171 is connected to ground for in turn holding the first capacitor plate 168 at ground potential in order to produce a ground plane and to configure the first capacitor plate 168 as the negative capacitor plate of the first capacitor 162. Additionally, by virtue of the fact that the first capacitor plate 168 forms a ground plane, the effect of external stray electric fields and relatively high frequency magnetic fields of frequencies greater than 20 KHz on the second capacitor plate 169, and in turn on the first capacitor 162 is minimised.

A retaining recess 178 extends around and into the support element 161 from the end 45 of the support element 161 and extends into the support element 161 from the end 45 in a generally longitudinal direction relative to the main central axis 6. The retaining recess 178 extends around the support element 161 to substantially define a cylinder for retaining the first substrate with the first and second capacitor plates 168 and 169 located thereon in the arcuate and substantially cylindrical configuration. The support element 161 is split by the radial slit 9 which facilitates retrofitting of the support element 161 and in turn the voltage sensing device 160 onto a conductor 2 with the conductor extending substantially longitudinally through the central opening 8.

In use, with the voltage sensing device 160 located on a conductor 2 with the conductor 2 extending longitudinally through the central opening 8 of the support element 161, an alternating voltage in the conductor 2 induces a voltage in the first capacitor 162 which in turn is produced across the output terminals 171 and 172 and is indicative of the alternating voltage in the conductor 2.

Referring now to FIGS. 30 to 32, there is illustrated a voltage sensing device according to another embodiment of the invention indicated generally by the reference number 180 for producing a signal indicative of an alternating voltage in a conductor 2. The voltage sensing device 180 is substantially similar to the voltage sensing device 160 described with reference to FIGS. 27 to 29, and similar components are identified by the same reference numerals. The only difference between the voltage sensing device 180 and the voltage sensing device 160 is that the voltage sensing device 180 comprises a pair of capacitors, namely, the first capacitor 160 for producing the voltage indicative of the alternating voltage in the conductor 2, and a second capacitor 181 which produces a voltage indicative of that resulting from external stray electric fields and external stray magnetic fields of relatively high frequencies greater than 20 KHz. Accordingly, by applying the signals produced by the first and second capacitors 162 and 181 to suitable signal processing circuitry correction for the effect of external stray electric fields and external stray magnetic fields can be made to the signal indicative of the alternating voltage in the conductor 2 produced by the first capacitor 162.

In this embodiment of the invention, a second substrate 183 having first and second major surfaces 184 and 185, respectively, is provided to form a dielectric of the second capacitor 181. A third capacitor plate 187 is located on the second major surface 185 of the second substrate 183, and co-operates with the second substrate 183 and the first capacitor plate 168 of the first capacitor 162 to form the second capacitor 181. The first and second substrates 164 and 183 together with the first and second capacitor plates 168 and 169 and the third capacitor plate 187 are formed as a composite laminate. The second substrate 163 is similar to the first substrate 164 and is of similar area and dimensions. The third capacitor plate 187 is similar to the second capacitor plate 169 and comprises a third electrically conductive panel 188 which is formed on the second major surface 185 of the second substrate 183 by metal deposition, etching or by any other suitable process. The length and width dimensions of the third capacitor plate 187 are similar to the length and width dimensions of the second capacitor plate 169.

A third terminal (not shown) is provided on the second major surface 167 of the first substrate 164 in the output port 170, and is electrically connected to the third capacitor plate 187. The output port 170 is configured so that the first and second output terminals 171 and 172 and the third output terminal (not shown) can be coupled externally to suitable analysing circuitry.

The composite laminate comprising the first and second substrates 164 and 183 with the first and second capacitor plates 168 and 169 and the third capacitor plate 187 formed thereon is inserted into the retaining recess 178 in the support element 161 with the second capacitor plate 169 located between the first capacitor plate 168 and the main central axis 6 defined by the support element 161.

In this embodiment of the invention, the first capacitor plate 168 is held at ground so that the first capacitor plate 168 is configured as the negative plate of both the first and second capacitors 162 and 181, respectively. The voltage induced in the capacitor 162 is produced across the output terminals 171 and 172, and is indicative of the alternating voltage in the conductor 2. The voltage induced in the second capacitor 181 is produced across the first terminal 171 and the third terminal (not shown), and is indicative of the voltage resulting from the effect of external stray electric fields and external stray magnetic fields of relatively high frequency greater than 20 KHz. Accordingly, correction can be made for voltages induced in the first capacitor 162 by external stray electric magnetic fields by deducting the voltage signal produced across the first terminal 171 and the third terminal (not shown) from the voltage produced across the first and second terminals 171 and 172.

Otherwise, the voltage sensing device 180 and its use is similar to the voltage sensing device 160.

Referring now to FIGS. 33 to 35, there is illustrated a current sensing device according to a further embodiment of the invention indicated generally by the reference numeral 200. The current sensing device 200 is substantially similar to the current sensing device 1 described with reference to FIGS. 1 to 11, and similar components are identified by the same reference numerals. The main difference between the current sensing device 200 and the current sensing device 1 is that the current sensing device 200 comprises a voltage sensing means, namely, a capacitor 201, which is substantially similar to the capacitor 131 of the voltage sensing device 130 described with reference to FIGS. 22 to 24 and is formed on a carrier element 202, which is also according to the invention. The carrier element 202 is formed as a composite element, and comprises a primary substrate, which is similar to the primary substrate 12 of the current sensing device 1, and a secondary substrate 203 having first and second major surfaces 205 and 206, respectively. The coils 17 are located at spaced apart intervals along the primary substrate 12 on the first and second major surfaces 14 and 15 thereof, and are connected in series by electrically conductive tracks similar to the configuration of the coils and the electrically conductive tracks on the primary substrate 12 of the current sensing device 1.

First and second capacitor plates 208 and 209, respectively, are located on the first and second major surfaces 205 and 206 of the secondary substrate 203, respectively. A first layer 211 of an electrically insulating material is provided between the first capacitor plate 208 and the first major surface 14 of the primary substrate 12 over the coils 17 for electrically isolating the first capacitor plate 208 from the coils 17 on the first major surface 14 of the primary substrate 12.

A shielding means comprising an electrically conductive shield 212 is located adjacent the second major surface 15 of the primary substrate 12 for shielding the coils 17 from the effects of external stray electrical fields and external stray magnetic fields of relatively high frequency greater than 20 KHz. A second layer 214 of electrically insulating material is provided on the second major surface 15 of the primary substrate 12 over the coils 17 between the second major surface 15 and the electrically conductive shield 212 for electrically isolating the electrically conductive shield 212 from the coils 17 on the second major surface 15 of the primary substrate 12. The electrically conductive shield 212 is formed by an electrically conductive panel 215 which is formed on the second insulating layer 214 by metal deposition or by any other suitable means. The area of the electrically conductive shield 212 is similar to the area of the first substrate 12.

The primary and secondary substrates 12 and 203 are substantially similar to each other, and are of similar area and dimensions. The area of the first capacitor plate 208 is similar to the area of the secondary substrate 203. The dimensional relationship between the length and width of the second capacitor plate 209 relative to the first capacitor plate 208 is similar to the relationship between the length and the width of the first and second capacitor plates 115 and 116 of the current sensing device 110 described with reference to FIGS. 19 to 21.

First and second output ports 218 and 219, respectively, are located on the second major surface 206 of the secondary substrate 203. The first output port 218 comprises terminals 220 and 221 between which the coils 17 are connected in series and on which the voltage indicative of the alternating current flowing in the conductor 2 is produced. The second output port 219 comprises terminals 223 and 224 which are electrically coupled to the first and second capacitors 208 and 209, respectively. The coupling of the terminals 220 and 221 of the first output port 218 to the coils 17 is similar to that already described with reference to the current sensing device 1 by electrically conductive tracks 225 and 226, which are accommodated through appropriate vias 227 and 228 through the primary and secondary substrates 12 and 203, and the first insulating layer 211. The terminals 223 and 224 of the second output port 219 are connected to the first and second capacitor plates 208 and 209, respectively, by electrically conductive tracks 230 and 231 and through a via 232 through the second substrate 203. A third terminal 234 in the second output port 219 is connected to the electrically conductive shield 212 through a via 235 through the primary and secondary substrates 12 and 203 and to the first and second insulating layers 211 and 214.

When the carrier element 202 has been formed into a composite laminate comprising the primary and secondary substrates 12 and 203, the coils 17, the first and second capacitor plates 208 and 209 and the electrically conductive shield 212, the composition laminate forming the carrier element 202 is configured into the multi-channel arcuate configuration, and is inserted into the primary retaining recess 38 in the support element 5 with the second capacitor plate 209 located between the first capacitor plate 208 and the main central axis 6 defined by the support element 5.

In use, the first capacitor plate 208 and the electrically conductive shield 212 are held at ground.

Otherwise, the current sensing device 200 and its use is similar to the current sensing devices already described which comprise both a current sensing means and a voltage sensing means.

In the embodiments of the current sensing devices and the voltage sensing devices described herein, in general, the substrates which form the primary and secondary substrates in the case of the current sensing devices, and the first and second substrates of the voltage sensing devices in general are of thickness of the order of 0.04 mm, however, the substrates may be of thickness in the range of 0.01 mm to 2.0 mm.

In general, the coils will be formed on the primary substrate to a depth of approximately 0.24 mm, but may be formed to a depth in the range of 0.01 mm to 2.0 mm. The electrically conductive panels which form the electrically conductive shields and the first and second capacitor plates may be of any suitable thickness, and typically will be of thickness in the range of 0.01 mm to 2.0 mm, but most commonly will be of thickness of the order of 0.25 mm. Where an electrically insulating layer is located between the coils and a corresponding one of the electrically conductive panels which forms either an electrically conductive shield or one of the first and second capacitor plates, it is envisaged that the electrically insulating layer will be of thickness not greater than 0.1 mm, and may in fact be formed by a coating of an electrically conductive lacquer which would be of thickness of no more than 0.05 mm coated over the coils. Where the coils are formed by metal deposition, typically, the coils would be formed by metal sputtering, and where the electrically conductive panels which form the electrically conductive shields or the first and second capacitor plates are formed by metal deposition, typically, the electrically conductive panels would be formed by metal sputtering.

In all cases, the combined primary substrate with the coils formed thereon and the electrically conductive shield or shields and/or the first and second capacitor plates formed thereon will be formed prior to the assembly being bent into the multi-channel arcuate configuration.

It is envisaged that instead of coupling the electrically conductive shielding panels 151 and 152 of the carrier element 150 described with reference to FIGS. 25 and 26, the electrically conductive panels 151 and 152 of the carrier element 150 could be used as plates of a capacitor in a similar manner as the first and second capacitor plates 86 and 87 of the current sensing device 80 described with reference to FIGS. 14 to 17 have been used. In which case, the electrically conductive shielding panels 151 and 152 of the carrier element 150 would be coupled to terminals of a second output port on which the voltage induced across the electrically conductive shielding panels 151 and 152 would be produced.

While the primary and secondary substrates have been described as being of a specific material, the substrates may be of any suitable material, and similarly, the support elements may be of any other suitable material. Indeed, it will be readily apparent to those skilled in the art that the support elements need not be of a solid annular construction, in certain cases, it is envisaged that the support elements may be of hollow annular construction, and in which case retaining pins, for example, could be located in the support elements which would engage and retain the primary substrate in its multi-channel and arcuate configuration within the support element 5. Similarly, it is envisaged that the secondary substrate would similarly be located and retained in the arcuate, substantially cylindrical configuration in the support element.

It will also be appreciated that while it is desirable, it is not essential that planar coils be formed on both major surfaces of the primary substrate, the coils may be formed on one major surface only.

It will also be appreciated that the planar coils may be formed on one or both major surfaces of the primary substrate by any other suitable processes besides metal sputtering or etching, and it is envisaged that the coils, electrically conductive tracks and the electrically conductive capacitor and shielding panels may be formed by vapour deposition or by printing using an electrically conductive ink, or by any other process. It is also envisaged that the coils may be connected in series by separate conductors which would not be formed on the substrate. Needless to say, while it is advantageous to connect the coils in series by electrically conductive tracks configured as twisted pairs, this is not essential.

Additionally, while the coils have been described as being formed on a single primary substrate, it is envisaged in certain cases that each coil may be formed on a separate primary substrate, or a pair of coils may be formed on opposite major surfaces of each of a plurality of primary substrates, and the single coil or pair of coils on each primary substrate would be located in the radial recesses in the support element. The coil or coils on each primary substrate of the respective primary substrates would then be connected in series by wires or other suitable connections running from one primary substrate to the next. Indeed, it is envisaged in certain cases that self-supporting planar coils may be formed without a substrate, and the planar coils would be located in respective ones of the radial recesses of the primary retaining recess of the support element. The respective planar coils would then be connected in series by electrically conductive wires or by other suitable connecting means.

While the shielding means for shielding the coils from external stray electric and magnetic fields has been described as comprising electrically conductive shielding panels, any other suitable shielding means may be provided.

It will also be appreciated that in certain cases, the support element may be provided without being split, and in which case, the conductor would be threaded into and through the central opening of the support element. Furthermore, while the support element has been described as being split for facilitating retrofitting of the support element, any other suitable means of providing the support element for retrofitting onto a conductor may be used. For example, in certain cases, it is envisaged that instead of splitting the support element by a slit, the support element could be slit by a slot which would physically separate the respective adjacent ends of the support element from each other. Additionally, it is envisaged that the support element, instead of extending completely around the conductor, could be adapted to extend only partly around the conductor.

While the electrically conductive tracks which have been described for connecting the coils in series have been described as being configured as twisted pairs, while this is desirable, it is not essential, and in certain cases, it is envisaged that the electrically conductive tracks which join the coils in series may be provided by parallel tracks on the same, or on opposite sides of the primary substrate.

Additionally, it will be appreciated that while the current sensing devices have been described for use in determining and detecting alternating current flow in a conductor of a single phase and of a three-phase alternating current network, the current sensing devices according to the invention may be used for detecting and determining alternating current flow and imbalance current and the direction thereof in conductors of any multi-phase alternating current network. Similarly, where the current sensing devices are provided with voltage sensing means, the current sensing devices may be used for determining and detecting an imbalance current in any multi-phase alternating current system, and the direction and magnitude of the imbalance current in the multi-phase alternating current network.

It is also envisaged that the current sensing device described with reference to FIGS. 33 to 35 may be further adapted by adding a further substrate and a capacitor plate adjacent the electrically conductive shielding panel 212. In which case, the electrically conductive shielding panel 212 together with the additional adjacent substrate and the additional capacitor plate would form a further capacitor to produce a voltage indicative of the effect of stray electric and magnetic fields on the coils, as well as on the voltage sensing capacitor 201. The additional capacitor plate would typically be of size and area similar to the second capacitor plate 209 of the capacitor 201, and the electrically conductive shielding plate 212 would be held at ground and would form the negative plate of the additional capacitor. Correction for the effects of external stray electric and magnetic fields on the voltage signals produced by the coils and the capacitor 201 could be corrected by taking into account the voltage produced by the additional capacitor.

It is also envisaged that the current sensing device 110 described with reference to FIGS. 19 to 21 may be provided with the capacitor 112 formed with the carrier element 11 as a composite element. In which case, the carrier element 11 would be bonded to the capacitor 112 at spaced apart intervals along the length of the capacitor in a general circumferential direction relative to the main central axis 6 defined by the support element. The portions of the carrier element 11 which would be bonded to the capacitor 112 would be portions of the carrier element 11 between the coils 17, so that the capacitor 112 could be configured as a cylindrical capacitor with the carrier element 11 in the multi-channel arcuate configuration bonded thereto. The carrier element 11 with the capacitor 112 bonded thereto would then be retained in the support element with the capacitor 112 located between the carrier element 11 and the main central axis 6 of the support element.

The invention claimed is:

1. A current sensing device for producing a signal indicative of an alternating current flowing in a conductor, the current sensing device comprising:
   a support element defining a main central axis and having a central opening extending axially therethrough for accommodating the conductor substantially coaxially through the support element,
   a carrier comprising an elongated primary substrate defining opposite first and second major surfaces formed into a multi-channel arcuate configuration defining a plurality of adjacent channels extending parallel to the main central axis by bending the primary substrate along spaced apart transversely extending bend lines to form opposite side walls of the channels, the primary substrate being located in the support element in the multi-channel arcuate configuration extending around the main central axis with the bend lines and the channels extending substantially parallel to the main central axis, and the side walls defining planes extending substantially longitudinally along and substantially radially from the main central axis,
   a plurality of planar coils formed on the first and second major surfaces of the primary substrate on the respective side walls of the channels with the planar coils defining respective planes extending substantially along and substantially radially from the main central axis, and being circumferentially spaced apart around the main central axis of the support element and being electrically connected in series, so that voltages induced in the planar coils by an alternating current flowing in the conductor extending through the central opening in the support element are summed in phase to produce the signal indicative of the alternating current flowing in the conductor, and
   a shield for minimizing the effect of external stray electric and magnetic fields in the vicinity of the current sensing device on the planar coils.

2. The current sensing device as claimed in claim 1 in which the planar coils formed on the first major surface of the primary substrate are connected in series by conductors configured as twisted pairs.

3. The current sensing device as claimed in claim 2 in which the conductors configured as twisted pairs comprise electrically conductive tracks formed on the primary substrate, each track forming one conductor of a pair of conductors configured as a twisted pair comprises a plurality of interconnected segments formed alternately on the respective opposite first and second major surfaces of the primary substrate.

4. The current sensing device as claimed in claim 1 in which the planar coils formed on the second major surface of the primary substrate are equally spaced apart circumferentially around the main central axis of the support element.

5. The current sensing device as claimed in claim 1 in which the centre of radius of the primary substrate in the multi-channel arcuate configuration substantially coinciding with the main central axis defined by the support element.

6. The current sensing device as claimed in claim 1 in which the support element comprises a primary retaining recess for receiving and retaining the primary substrate in the multi-channel arcuate configuration.

7. The current sensing device as claimed in claim 1 in which each planar coil comprises an electrically conductive track formed on the corresponding one of the first and second major surfaces of the primary substrate.

8. The current sensing device as claimed in claim 1 in which the support element is radially split from the central opening for accommodating engagement of the support element onto the conductor with the conductor extending through the central opening of the support element for retrofitting the support element onto the conductor.

9. The current sensing device as claimed in claim 1 in which a voltage sensor is provided for producing a signal indicative of an alternating voltage present in the conductor.

10. The current sensing device as claimed in claim 9 in which the voltage sensor comprises a capacitor having a first electrically conductive capacitor plate and a second electrically conductive capacitor plate spaced apart from the first capacitor plate, the first capacitor plate being located adjacent the second major surface of the primary substrate with the planar coils on the second major surface of the primary substrate located between the second major surface of the primary substrate and the first capacitor plate, and the second capacitor plate being located adjacent the first major surface of the primary substrate with the planar coils on the first major surface of the primary substrate located between the first major surface of the primary substrate and the second capacitor plate, the second capacitor plate being electrically insulated from the planar coils on the first major surface of the primary substrate by a first layer of electrically insulating material located between the second capacitor plate and the planar coils on the first major surface of the primary substrate, the first capacitor plate being electrically insulated from the planar coils on the second major surface of the primary substrate by a second layer of electrically insulating material located between the first capacitor plate and the planar coils on the second major surface of the primary substrate.

11. The current sensing device as claimed in claim 1 in which the second capacitor plate is located between the first capacitor plate and the main central axis defined by the support element.

12. The current sensing device as claimed in claim 10 in which an area of the second capacitor plate is less than an area of the first capacitor plate.

13. The current sensing device as claimed in claim 10 in which an area of the first capacitor plate is substantially similar to an area of the primary substrate.

14. The current sensing device as claimed in claim 1 in which the planar coils formed on the first major surface of the primary substrate are equally spaced apart circumferentially around the support element.

15. The current sensing device as claimed in claim 1 in which the primary substrate in the multi-channel arcuate configuration extends substantially completely around the main central axis.

16. The current sensing device as claimed in claim 1 in which the primary substrate comprises a flexible electrically insulating material.

17. The current sensing device as claimed in claim 1 in which the shield comprises an electrically conductive shield located on the primary substrate over the planar coils on at least one of the first and second major surfaces thereof.

18. The current sensing device as claimed in claim 17 in which both the first and second major surfaces of the primary substrate are provided with the electrically conductive shields.

19. The current sensing device as claimed in claim 17 in which the electrically conductive shield is located on the primary substrate over the planar coils on one of the first and second major surfaces thereof remote from the main central axis defined by the support element.

20. The current sensing device as claimed in claim 17 in which the electrically conductive shield is electrically insulated from the adjacent planar coils by a layer of electrically insulating material located between the electrically conductive shield and the planar coils.

21. The current sensing device as claimed in claim 17 in which each electrically conductive shield comprises an electrically conductive panel.

22. The current sensing device as claimed in claim 17 in which an area of each electrically conductive shield is substantially similar to an area of the primary substrate.

23. The current sensing device as claimed in claim 17 in which each electrically conductive shield is adapted for coupling to a ground so that the electrically conductive shield forms a ground phase.

24. The current sensing device as claimed in claim 17 in which each electrically conductive shield comprises an electrically conductive material formed on the primary substrate by one of printing, metal deposition and etching.

25. The current sensing device as claimed in claim 1 in which the support element comprises a resilient material.

26. A method for producing a signal indicative of an alternating current flowing in a conductor, the method comprising:
   providing a support element defining a main central axis and having a central opening extending axially therethrough for accommodating the conductor substantially coaxially to the support element,
   providing a carrier comprising an elongated primary substrate defining opposite first and second major surfaces,
   bending the primary substrate along spaced apart transversely extending bend lines into a multi-channel arcuate configuration defining a plurality of adjacent channels having opposite side walls,
   locating the primary substrate in the support element in the multi-channel arcuate configuration extending around the main central axis with the bend lines and the channels extending substantially parallel to the main central axis, and the side walls defining planes extending substantially longitudinally along and substantially radially from the main central axis,
   forming a plurality of planar coils on the first and second major surfaces of the primary substrate on the respective side walls of the channels with the planar coils defining respective planes extending substantially along and substantially radially from the main central axis of the support element and being spaced apart circumferentially around the main central axis, providing a shield means shield for minimizing the effect of external stray electric and magnetic fields in the vicinity of the current sensing device on the planar coils, electrically connecting the planar coils in series so that voltages induced in the planar Coils the alternating current flowing in the conductor are summed in phase to produce the signal indicative of the alternating current flowing in the conductor, and locating the conductor in the central opening extending coaxially through the central opening of the support element, and reading the produced signal indicative of the alternating current flowing in the conductor.

27. The method as claimed in claim 26 in which the planar coils are connected in series by conductors configured as twisted pairs.

* * * * *